US010965488B2

(12) United States Patent
Wright et al.

(10) Patent No.: US 10,965,488 B2
(45) Date of Patent: Mar. 30, 2021

(54) SYSTEM AND METHOD FOR MONITORING A PROPERTY

(71) Applicant: Alert Labs Inc., Kitchener (CA)

(72) Inventors: Kevin Robertson Wright, Waterloo (CA); Terrance Carl Schmidt, Wellesley (CA); George Tsintzouras, Kitchener (CA); Christopher Todd Kirby, Waterloo (CA)

(73) Assignee: Alert Labs Inc., Kitchener (CA)

( * ) Notice: Subject to any disclaimer, the term of this patent is extended or adjusted under 35 U.S.C. 154(b) by 0 days.

(21) Appl. No.: 16/118,382

(22) Filed: Aug. 30, 2018

(65) Prior Publication Data

US 2018/0375680 A1 Dec. 27, 2018

Related U.S. Application Data

(63) Continuation of application No. PCT/CA2017/050306, filed on Mar. 7, 2017.
(Continued)

(51) Int. Cl.
*H04L 12/28* (2006.01)
*G06Q 50/06* (2012.01)
(Continued)

(52) U.S. Cl.
CPC ...... *H04L 12/2825* (2013.01); *F24D 19/1048* (2013.01); *F24D 19/1063* (2013.01);
(Continued)

(58) Field of Classification Search
None
See application file for complete search history.

(56) References Cited

U.S. PATENT DOCUMENTS 5,677,496 A * 10/1997 Mochizuki ............... G01F 1/60
73/601
7,360,413 B2 4/2008 Jeffries et al.
(Continued)

FOREIGN PATENT DOCUMENTS

EP 1909073 A1 4/2008

OTHER PUBLICATIONS

Stobbelaar, M.; Supplementary Search Report from corresponding European Application No. 17762376.6; search completed Oct. 1, 2019.
(Continued)

*Primary Examiner* — Curtis A Kuntz
*Assistant Examiner* — Jerold B Murphy
(74) *Attorney, Agent, or Firm* — CPST Intellectual Property Inc.; Brett J. Slaney

(57) ABSTRACT

There are provided systems and methods for monitoring a property using a system of sensor units in one or more premises on the property that can interface with respective utilities entering the premises or being generated by appliances on the premises with a minimal of effort and without requiring modification of the utility's equipment or the appliance. The systems and methods are connectable to a cloud-based monitoring, analytics and notification system via a long range network connection directly from one or more of the sensor units. The system of sensors can also incorporate primary and secondary units with at least one primary unit capable of communicating directly to the cloud-based system/server via a long-range connection with the secondary units sending data to the cloud via the primary unit by communicating at the property via a short-range communication connection. There are also provided various sensor units for specifically monitoring water flow and water leakage, flooding, sump pump operability, levels within
(Continued)

water softeners and other fluid containing vessels, electrical power usage, furnace operations, among others as described herein.

42 Claims, 18 Drawing Sheets

Related U.S. Application Data

(60) Provisional application No. 62/304,733, filed on Mar. 7, 2016.

(51) Int. Cl.

| | | |
|---|---|---|
| G01F 1/075 | (2006.01) | |
| G01F 25/00 | (2006.01) | |
| G08B 19/00 | (2006.01) | |
| G01F 23/00 | (2006.01) | |
| G01D 21/00 | (2006.01) | |
| G01M 3/28 | (2006.01) | |
| G01D 4/00 | (2006.01) | |
| F24D 19/10 | (2006.01) | |
| G08B 25/10 | (2006.01) | |
| G01D 11/30 | (2006.01) | |
| H04W 4/38 | (2018.01) | |
| G01R 22/06 | (2006.01) | |

(52) U.S. Cl.
CPC ......... *F24D 19/1081* (2013.01); *G01D 4/008* (2013.01); *G01D 11/30* (2013.01); *G01D 21/00* (2013.01); *G01F 23/00* (2013.01); *G01F 25/00* (2013.01); *G01M 3/2807* (2013.01); *G06Q 50/06* (2013.01); *G08B 19/00* (2013.01); *G08B 25/10* (2013.01); *H04W 4/38* (2018.02); *G01R 22/063* (2013.01); *Y02B 90/20* (2013.01); *Y04S 20/30* (2013.01)

(56) References Cited

U.S. PATENT DOCUMENTS

| | | | |
|---|---|---|---|
| 8,279,080 B2 | 10/2012 | Pitchford et al. | |
| 8,719,187 B2* | 5/2014 | Milanes Garcia-Moreno | G01F 15/002 705/413 |
| 9,470,563 B1* | 10/2016 | DeVerse | A61B 5/02 |
| 2002/0161536 A1 | 10/2002 | Suh et al. | |
| 2006/0012485 A1* | 1/2006 | Tacilauskas | G01M 3/16 340/604 |
| 2010/0289652 A1* | 11/2010 | Javey | G06F 3/0484 340/605 |
| 2010/0295672 A1 | 11/2010 | Hyland et al. | |
| 2013/0096954 A1* | 4/2013 | Bodas | G06Q 10/10 705/4 |
| 2013/0113631 A1* | 5/2013 | Pitchford | G01D 21/00 340/870.02 |
| 2014/0183386 A1* | 7/2014 | Ravid | G01F 1/115 251/129.01 |
| 2015/0204701 A1 | 7/2015 | Klicpera | |
| 2016/0189513 A1* | 6/2016 | Sloo | G08B 25/005 340/522 |
| 2016/0259307 A1* | 9/2016 | Matsuoka | H04L 12/2807 |

OTHER PUBLICATIONS

Kotylak, T.; International Search Report from corresponding PCT Application No. PCT/CA2017/050306; search completed Jun. 19, 2017.

* cited by examiner

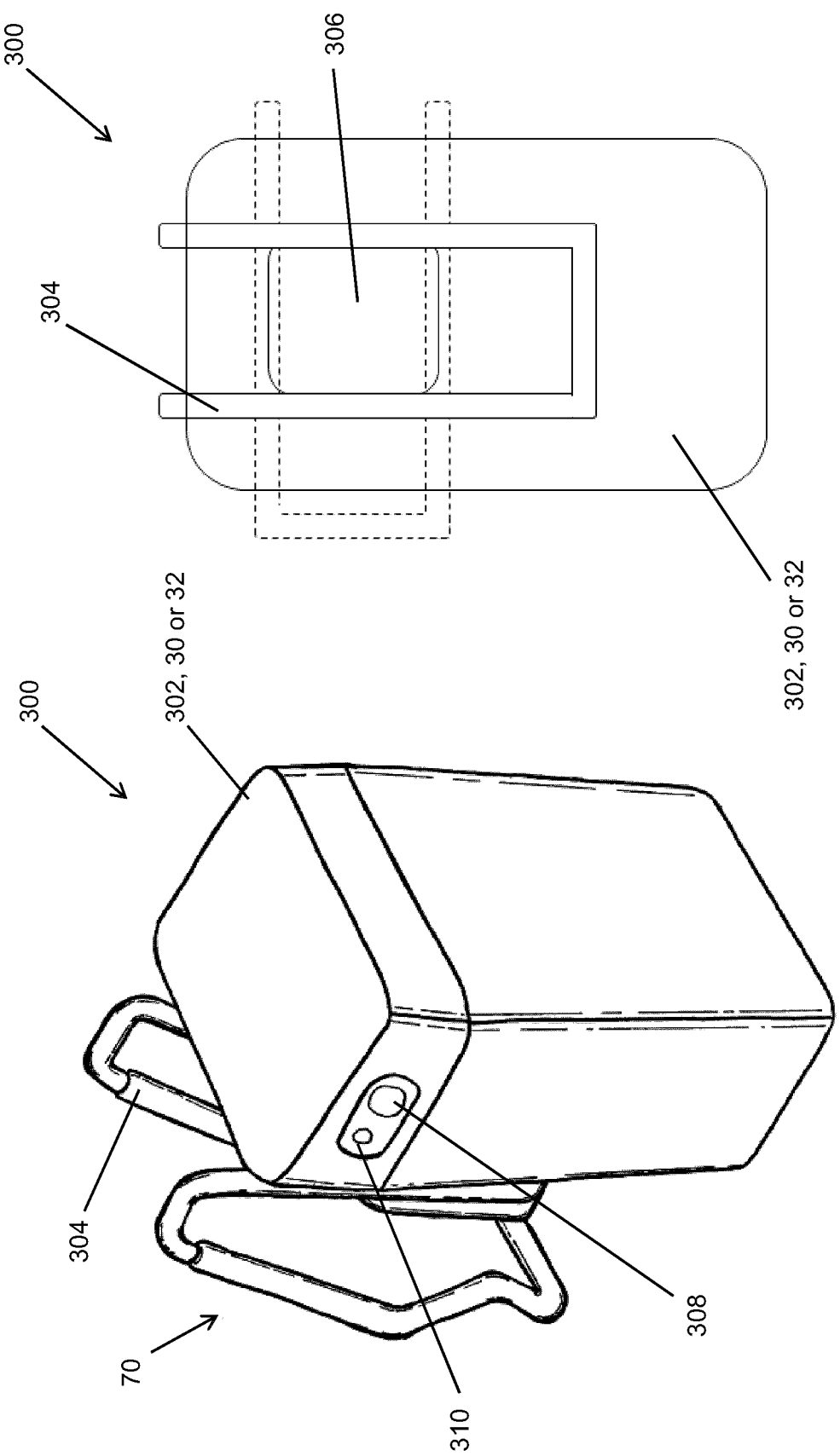

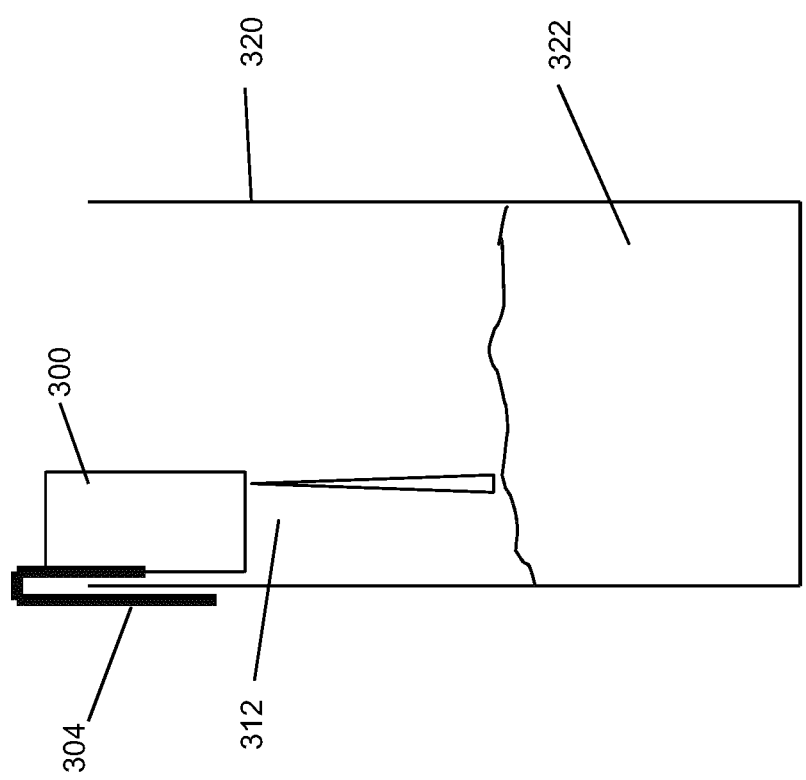

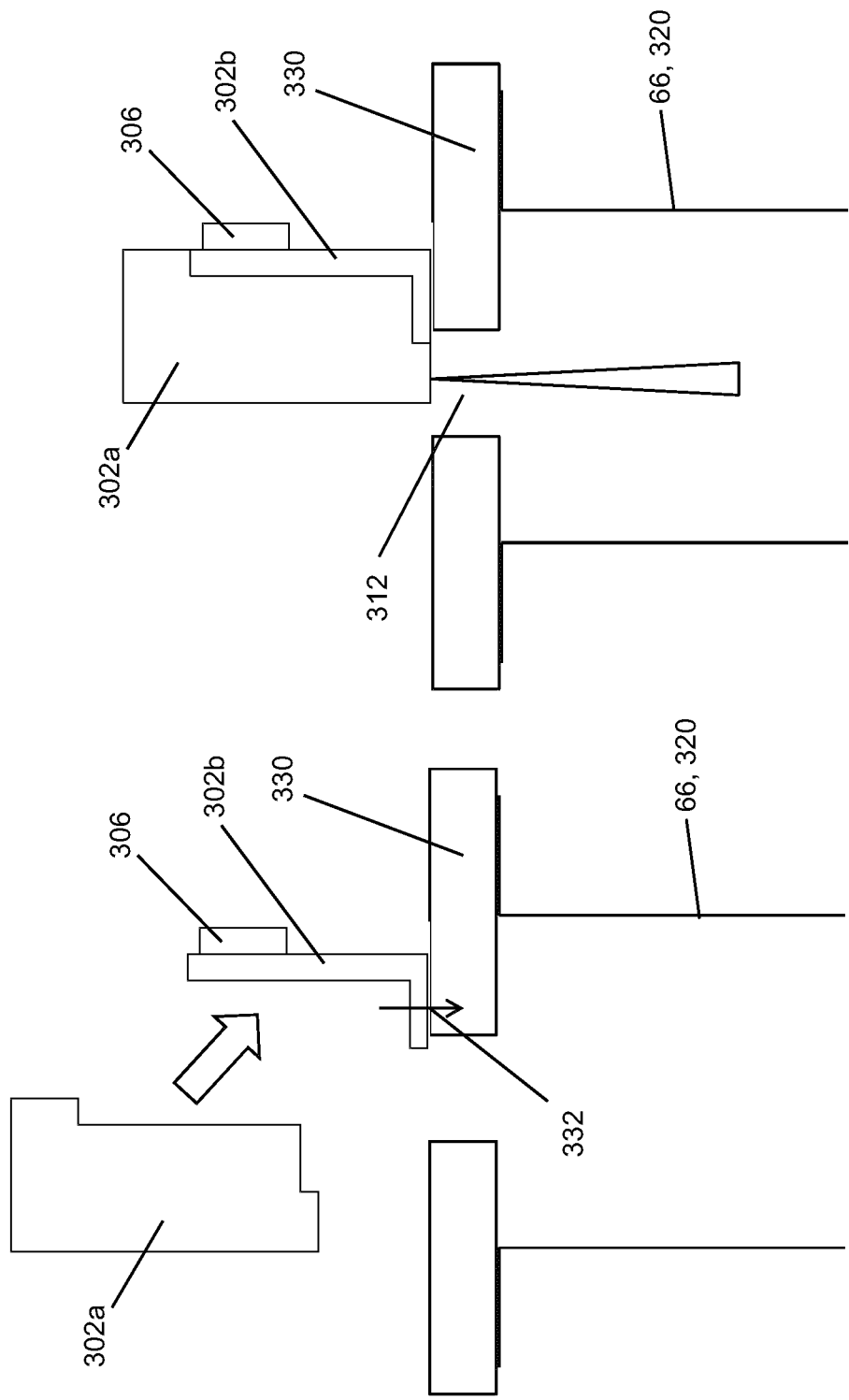

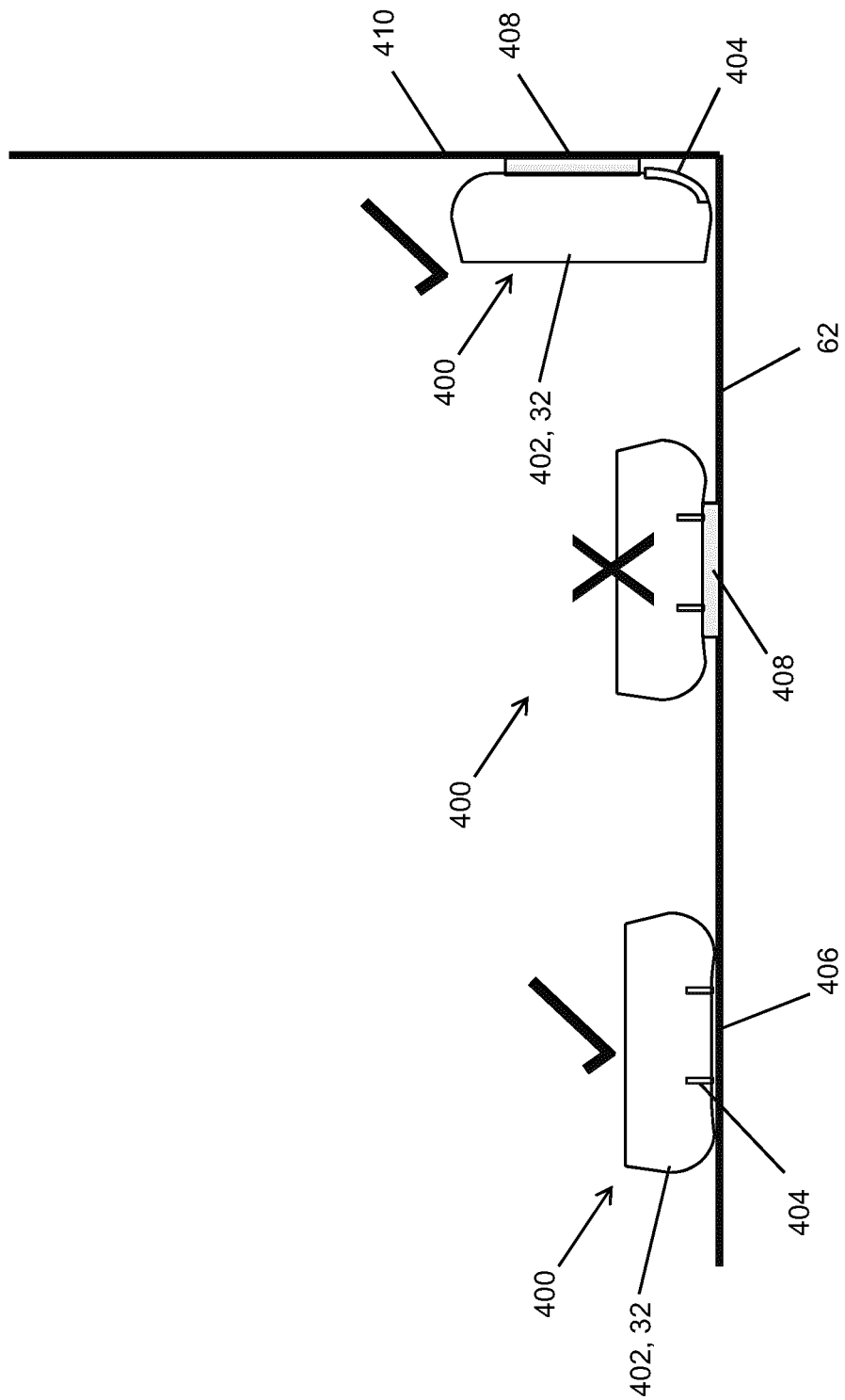

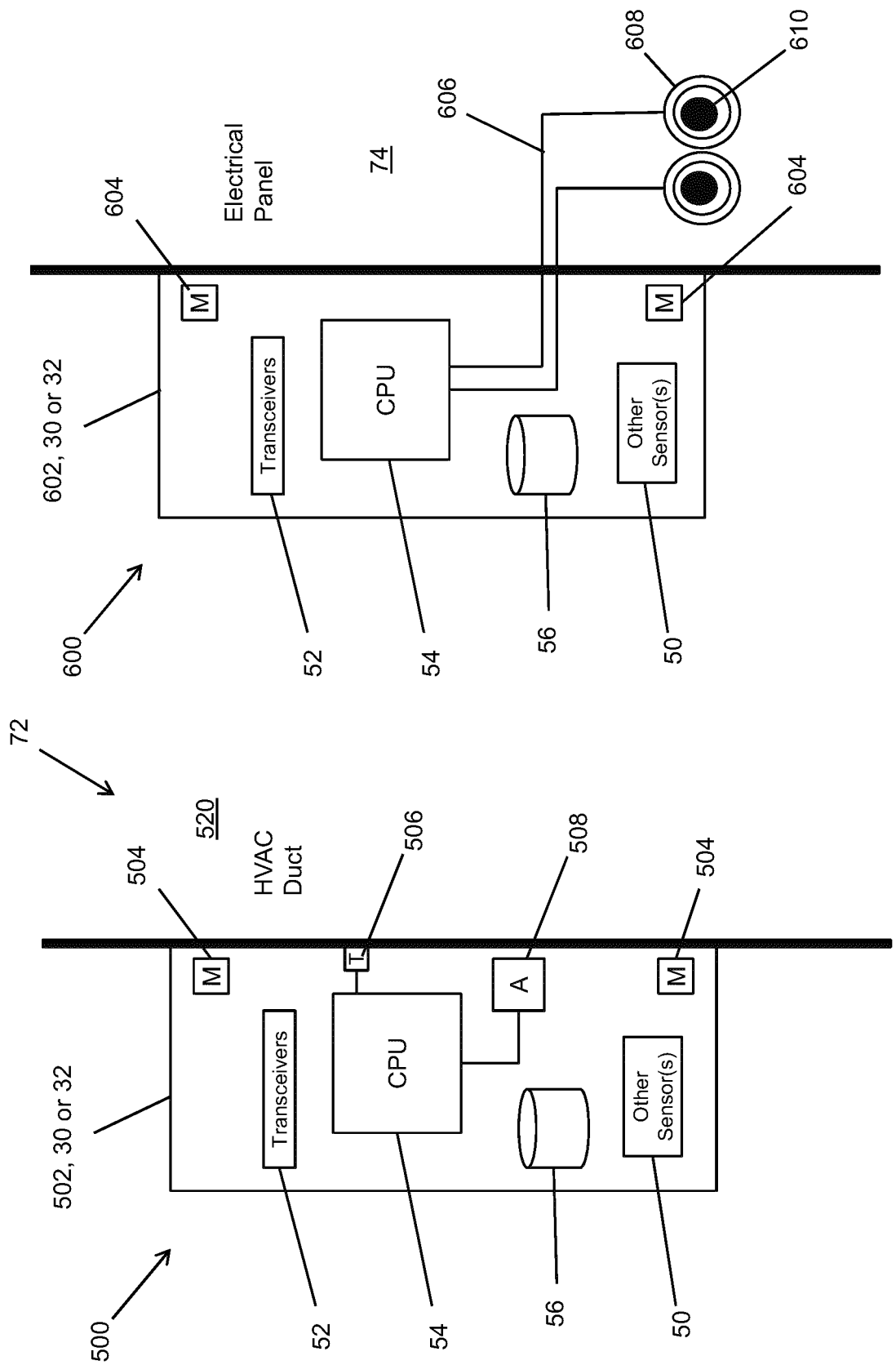

SYSTEM AND METHOD FOR MONITORING A PROPERTY

CROSS-REFERENCE TO RELATED APPLICATION(S)

This application is a continuation of PCT Application No. PCT/CA2017/050306 filed on Mar. 7, 2017, which claims priority to U.S. Provisional Patent Application No. 62/304,733 filed on Mar. 7, 2016, both incorporated herein by reference.

TECHNICAL FIELD

The following relates to systems and methods for monitoring a property, particularly for monitoring utilities used at the property, such as by passively monitoring water flow, leak detection, and appliance operations in a premises.

DESCRIPTION OF THE RELATED ART

Most modern buildings within cities have water metering systems which will track water consumption for the purposes of billing by volume of water consumed. Traditionally, these systems had physical meters which were viewed in person by municipal agents, but more recently meters which can be read electronically have been introduced; either as retrofits to existing meters, or as new units. In both cases these units generally work by having the flowing water rotate a magnet inside the device while the meter monitors and counts rotations of the magnetic field to calculate volume of water flow. To date, the systems installed by municipalities are still passive in nature—requiring an agent to request water consumption data from the meter periodically.

There exist solutions to more actively monitor water consumption which require proprietary systems to be inserted into the water supply system. These systems function similarly to the municipal meters, but also have controls in place that allow them to gather data in real time and act to passively or actively inform users of water consumption, however these systems require trained professional installers and are themselves expensive. These solutions are traditionally seen in large commercial and industrial buildings where the high cost of installing such a system can be absorbed.

Other proposed systems not commercially available would allow for the monitoring of water flow from a passive external system by monitoring the rotation of the internal magnet, but due to the relatively weak strength of the magnetic signal, these systems involve sensitive manual calibration to separate signal from noise at the high levels of amplification required to get a readable and reliable signal from the magnetic field.

Accordingly, it is desired to have a system and method with which customers can actively monitor water consumption through existing water supply systems, which does not require professional installation and will both accurately measure regular water consumption and detect small leaks in the system.

SUMMARY

There are provided systems and methods for monitoring a property using a system of sensor units in one or more premises on the property that can interface with respective utilities entering the premises or being generated by appliances on the premises (e.g., via an HVAC system—generally a "sub-system") with a minimal of effort and without requiring modification of the utility's equipment or the appliance. The system and methods described herein are connectable to a cloud-based monitoring, analytics and notification system via a long range network connection directly from one or more of the sensor units. In this way, the need to integrate the sensor units into an existing local network to access internet connection can be eliminated while enabling continuous and/or periodic logging of a respective utility or appliance operation with little to no set up required by the user after interfacing the unit with the monitored sub-system.

The system of sensors can also incorporate primary and secondary units with at least one primary unit capable of communicating directly to the cloud-based system/server via a long-range connection with the secondary units sending data to the cloud via the primary unit by communicating at the property via a short-range communication connection. Such secondary units can be configured for continuous or periodic logging of data or can be event-triggered requiring less processing power and energy to operate.

There are also provided various sensor units for specifically monitoring water flow and water leakage, flooding, sump pump operability, levels within water softeners and other fluid containing vessels, electrical power usage, furnace operations, among others as described herein.

In one aspect, there is provided a sensor system for monitoring a property, the system comprising: a primary sensor unit, comprising: a housing comprising an interface mechanism for positioning at least one sensor contained within or supported by the housing relative to an entity to be monitored, wherein the entity to be monitored comprises a measurable characteristic that changes over time, wherein the interface mechanism comprises a portion of the housing or an additional component that maintains the positioning of the housing without altering entity to be monitored; at least one transceiver connectable to a cloud-based system via a long-range communication connection; a processor and memory contained in the housing for operating the at least one transceiver and the at least one sensor to measure or obtain data from the monitored entity, and provide the data to the cloud-based system over the long-range communication connection; and a power source for providing electrical power to the primary sensor unit.

In an implementation, the sensor system further comprises a secondary sensor unit comprising: a housing comprising an interface mechanism for positioning at least one sensor contained within or supported by the housing relative to an entity to be monitored, wherein the entity to be monitored comprises a measurable characteristic that changes over time, wherein the interface mechanism comprises a portion of the housing or an additional component that maintains the positioning of the housing without altering entity to be monitored; at least one transceiver connectable to the primary sensor unit via a short-range communication connection; a processor and memory contained in the housing for operating the at least one transceiver and the at least one sensor to measure or obtain data from the monitored entity, and provide the data to the cloud-based system via the primary sensor unit over the long-range communication connection by sending the data to the primary sensor unit via the short-range communication connection; and a power source for providing electrical power to the secondary sensor unit.

In another aspect, there is provided a method of monitoring a property, the method comprising: positioning at least one sensor contained within a housing of a primary sensor unit relative to an entity being monitored using an interface mechanism of the housing, wherein the entity to be monitored comprises a measurable characteristic that changes over time, wherein the interface mechanism comprises a portion of the housing or an additional component that maintains the positioning of the housing without altering entity to be monitored; operating the at least one sensor to measure or obtain data from the monitored entity; and utilizing at least one transceiver to provide the data to a cloud-based system over a long-range communication connection.

In yet another aspect, there is provided a water flow monitoring unit, comprising: a housing comprising an interface mechanism for positioning at least one magnetic sensor contained within the housing relative to a water meter to be monitored, wherein the water meter comprises a measurable magnetic characteristic that changes over time, wherein the interface mechanism comprises a contoured portion of the housing that maintains the positioning of the housing without altering the water meter; at least one transceiver connectable to a cloud-based system via a long-range communication connection; a processor and memory contained in the housing for operating the at least one transceiver and the at least one magnetic sensor to measure the measurable magnetic characteristic, and provide the data to the cloud-based system over the long-range communication connection; and a power source for providing electrical power to the water flow monitoring unit.

In yet another aspect, there is provided a quantity level monitoring unit, comprising: a housing comprising an interface mechanism for positioning at least one proximity sensor contained within the housing relative to a quantity level to be monitored, wherein the quantity level changes over time, wherein the interface mechanism maintains the positioning of the housing relative to a vessel containing the quantity level to be monitored without altering the vessel; at least one transceiver connectable to a cloud-based system via a long-range communication connection; a processor and memory contained in the housing for operating the at least one transceiver and the at least one proximity sensor to measure the quantity level, and provide the data to the cloud-based system over the long-range communication connection; and a power source for providing electrical power to the quantity level monitoring unit.

In yet another aspect, there is provided an electricity consumption monitoring unit, comprising: a housing comprising one or more magnets for securing the housing to an electrical panel containing an electrical component to be monitored, wherein the electrical component comprises a measurable characteristic that changes over time; at least one sensor for measuring the electrical component in the electrical panel; at least one transceiver connectable to a cloud-based system via a long-range communication connection; a processor and memory contained in the housing for operating the at least one transceiver and the at least one sensor to measure the measurable electrical characteristic, and provide the data to the cloud-based system over the long-range communication connection; and a power source for providing electrical power to the electricity consumption monitoring unit.

In yet another aspect, there is provided a furnace monitoring unit, comprising: a housing comprising one or more magnets for securing the housing to an HVAC duct for the furnace being monitored, wherein the HVAC duct carries a measurable characteristic that changes over time; at least one sensor for measuring the measurable characteristic; at least one transceiver connectable to a cloud-based system via a long-range communication connection; a processor and memory contained in the housing for operating the at least one transceiver and the at least one sensor to measure the measurable characteristic, and provide the data to the cloud-based system over the long-range communication connection; and a power source for providing electrical power to the furnace monitoring unit.

In yet another aspect, there is provided a flood detection unit, comprising: a housing comprising at least one surface that is contoured for positioning at least one sensor contained within the housing relative to an underlying surface to be monitored, wherein the underlying surface is normally dry and the at least one sensor is to detect a presence of a spill or flood; at least one transceiver connectable to a primary sensor unit via a short-range communication connection, the primary sensor being connected to a cloud-based system via a long-range communication connection; a processor and memory contained in the housing for operating the at least one transceiver and the at least one sensor to detect the presence of a spill or flood, and when detected, provide data to the primary sensor unit over the short-range communication connection; and a power source for providing electrical power to the flood detection unit.

BRIEF DESCRIPTION OF THE DRAWINGS

Embodiments will now be described by way of example only with reference to the appended drawings wherein:

FIG. 12 is a perspective view of a sensor unit for monitoring fluid levels in a sump well or fluid-containing vessel;

FIG. 13 is a rear elevation view of a configurable clip for mounting the sensor unit in multiple configurations to suit a particular application;

FIG. 16 is a schematic elevation view of the sensor unit of FIG. 12 mounted on the rim of a fluid-containing vessel;

FIGS. 17A and 17B are schematic elevation views of the sensor unit of FIG. 12 being mounted to the lid of a well or vessel;

FIG. 18 is an elevation view of a flood monitoring sensor unit in various positions relative to a floor and wall;

FIG. 19 is a schematic view of a magnetically installed sensor unit for monitoring an HVAC duct;

FIG. 20 is a schematic view of a magnetically installed sensor unit for monitoring electrical power consumption within an electrical panel.

DETAILED DESCRIPTION

Figure 1:
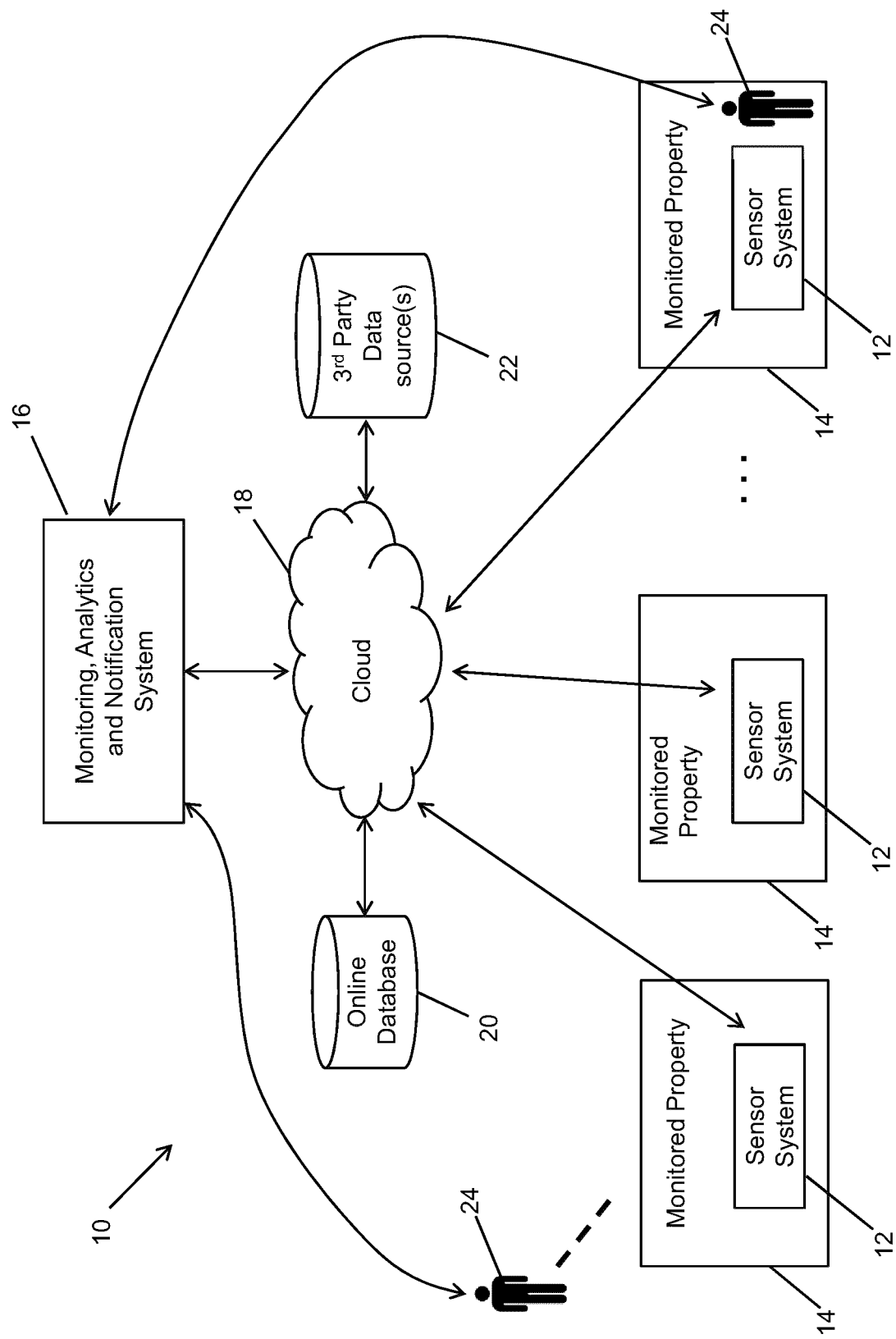
FIG. 1 is a schematic diagram of a system for monitoring properties.

Turning now to the figures, FIG. 1 illustrates a system 10 for monitoring properties, each having one or more premises, for one or more users or entities. In FIG. 1 a sensor system 12 is deployed at each of a number of monitored properties 14, and is communicable within the system 12 to provide data to a monitoring, analytics and notification system 16 that is accessible from or otherwise on or within a cloud 18 or cloud-based service (hereinafter the "cloud or cloud-based system 16").

While the example configuration shown in FIG. 1 provides for a centralized service for many monitored properties 14 on behalf of many owners/operators/occupants, it can be appreciated that the system 10 can also be deployed in a closed system, e.g., for a commercial or industrial enterprise having multiple buildings and a dedicated central system 16 that may or may not be accessible to that enterprise via the cloud 18. As such, it can be appreciated that the principles discussed herein can apply to various configurations to suit various applications.

In addition to the cloud-based system 16, an online database 20 can be provided for storing the data collected by the system 16. One or more 3$^{rd}$ party data sources 22 can also be accessed to obtain additional information such as weather, news, and other data that could impact the utilities being monitoring on the various premises. As illustrated in FIG. 1, a user 24 may access the cloud-based system 16 to view the data that is collected by its sensor system 12, and this may be done via an internet connection within the monitored property 14 (e.g., from a home computer) and/or from outside the monitored property 14 via a connection to the cloud (e.g., from a mobile device such as a smart phone or tablet with a cellular or WiFi connection). In this way, the users of the system 16 can monitor their sensor units and their properties 14 from anywhere, at any time, and can be notified of events and alerts. It can be appreciated that the number and nature of such events and alerts can be dictated by the system 16 and/or can be tailored to each user, by way of user-accessible dashboards and portals as explained in greater detail below.

Figure 2:
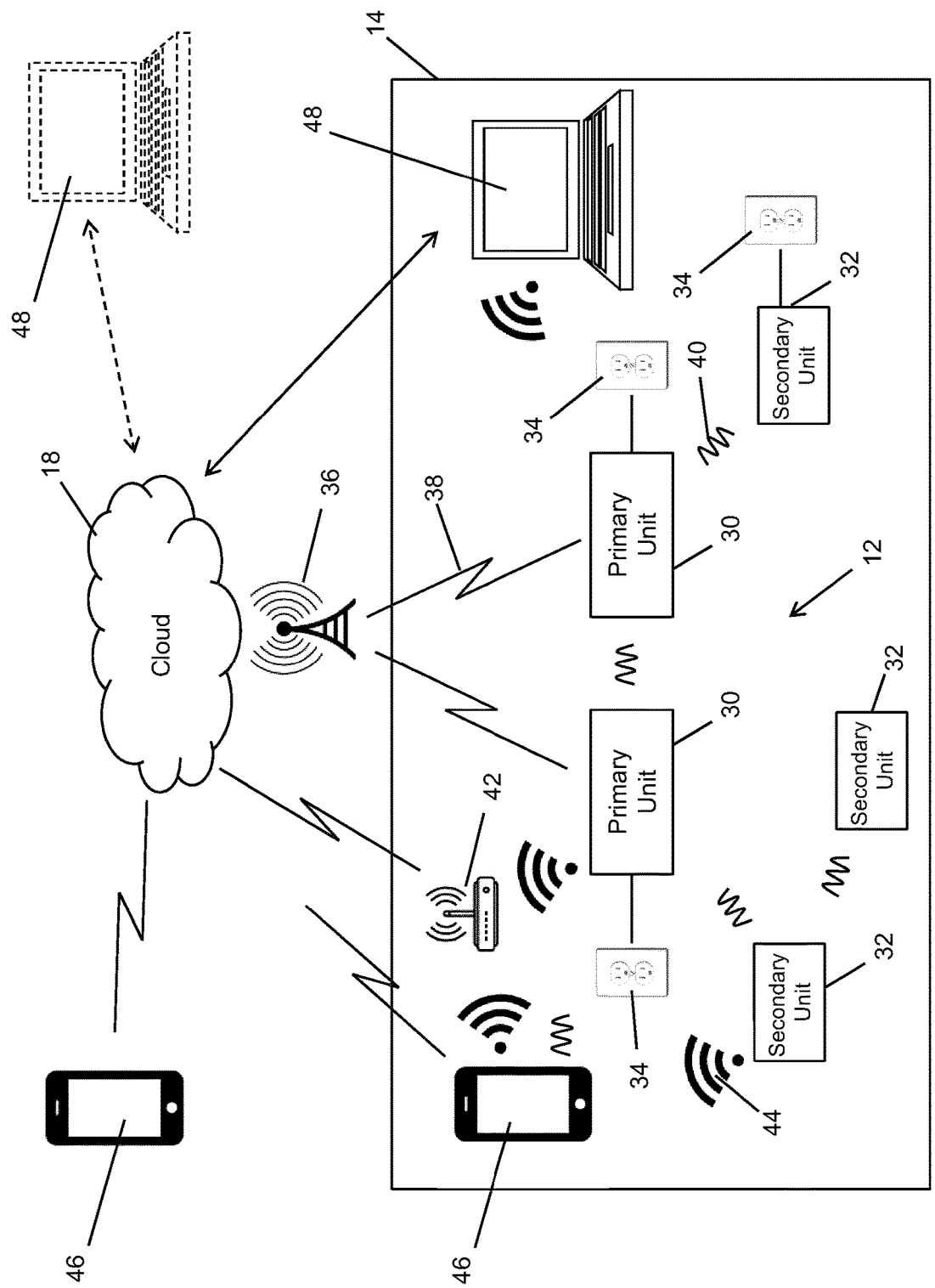
FIG. 2 is a schematic diagram of a monitored property.

FIG. 2 provides additional detail concerning a sensor system 12 deployed in a particular example of a monitored property 14 to illustrate the connectivity capabilities of the sensor system 12, which avoids the user having to necessarily pair and integrate the sensor system 12 into an existing local network. In this example, the sensor system 12 includes a pair of primary units 30 and a set of secondary units 32. Each primary unit 30 includes at least one capability for communicating with the cloud 18 via a long-range network connection 38. In this example, both of the primary units 30 are capable of communicating with a cellular network 36 to reach the cloud 18. Because of this capability, the primary units 30 are preferably connected to a continuous power source, such as an electrical outlet 34 in the monitored property 14. This allows for continuous or periodic logging and the transmission of data to the cloud 18 from the primary units 30.

It may be noted that a cellular-based long-range communication connection 38 is particularly advantageous since the primary units 30 do not require pairing or configuration within a local network, and can communicate with the cloud 18 in the event of a power outage, with on-board back-up battery power. However, as illustrated in FIG. 2, the primary units 30 can also include a short-range WiFi connection 44 to a modem 42 or other networking device within the monitored property 14 that is also capable of connecting to the cloud 18. In other words, while certain long-range communication schemes may be preferable or suitable to particular applications, the principles discussed herein can be applied within any existing or future network configuration that allows for at least one primary unit 30 in the monitored property 14 to reach the cloud 18 via a long-range communication capability 38. It can be appreciated that any such local connectivity capabilities such as WiFi 44 also allow mobile device 46 and other computing devices 48 to communicate with the primary and second units 30, 32.

The set of secondary units 32 are operable in a manner similar to the primary units 32 in terms of monitoring and logging a respective utility or appliance, but are distinguished from the primary units 32 by relying on the long-range communication connection 38 of one or more primary units 32. This is accomplished by providing a short-range communication capability 40 in each secondary unit 32 that is also provided in the primary units 32 to enable short-range communications within the monitored property 14. For example, the primary and secondary units 30, 32 can be equipped with any available short-range radio that has a suitable range according to the expected distances between the primary and secondary units 30, 32. A suitable type of radio is a 915 mHz LoRA radio, which has a particularly long range and is particularly suitable for large properties such as multi-unit residential, commercial and industrial premises. It can be appreciated that other short-range communication connections 40 such as Bluetooth are also possible. In other scenarios, an existing WiFi or other local area network can also be used a primary or back-up local communication capability for enabling the secondary units 32 to communicate with the primary unit(s) 30 in the monitored property 14.

The secondary units 32 can be given various capabilities and can be low-power event-triggered devices that operate on battery power as explained in greater detail below, or can be higher-power devices that perform additional monitoring and thus preferably include a connection to an electrical output 34 as shown by the example alternatives in FIG. 2. It can also be appreciated that a secondary unit 32 can also be retrofitted or otherwise convertible to a primary unit 30 by adding a long range communication capability (e.g., by adding a cellular antenna) or otherwise "turning on" such a capability. It can be appreciated that depending on the configuration of the sensor system 12 any one or more of the sensor units can be designated a primary unit 30 or secondary unit 32 when configuring the system to suit the needs of the property, to minimize cellular charges, to maximize (or minimize) data flows between units 30, 32, etc. Moreover, as illustrated in FIG. 2, secondary units 32 can be operable to communicate with each other using the short-range communication connection 40 to create a mesh-type network to allow units 32 outside of the range of the primary unit(s) 30 to still be connected into the sensor system 12.

Figure 3:
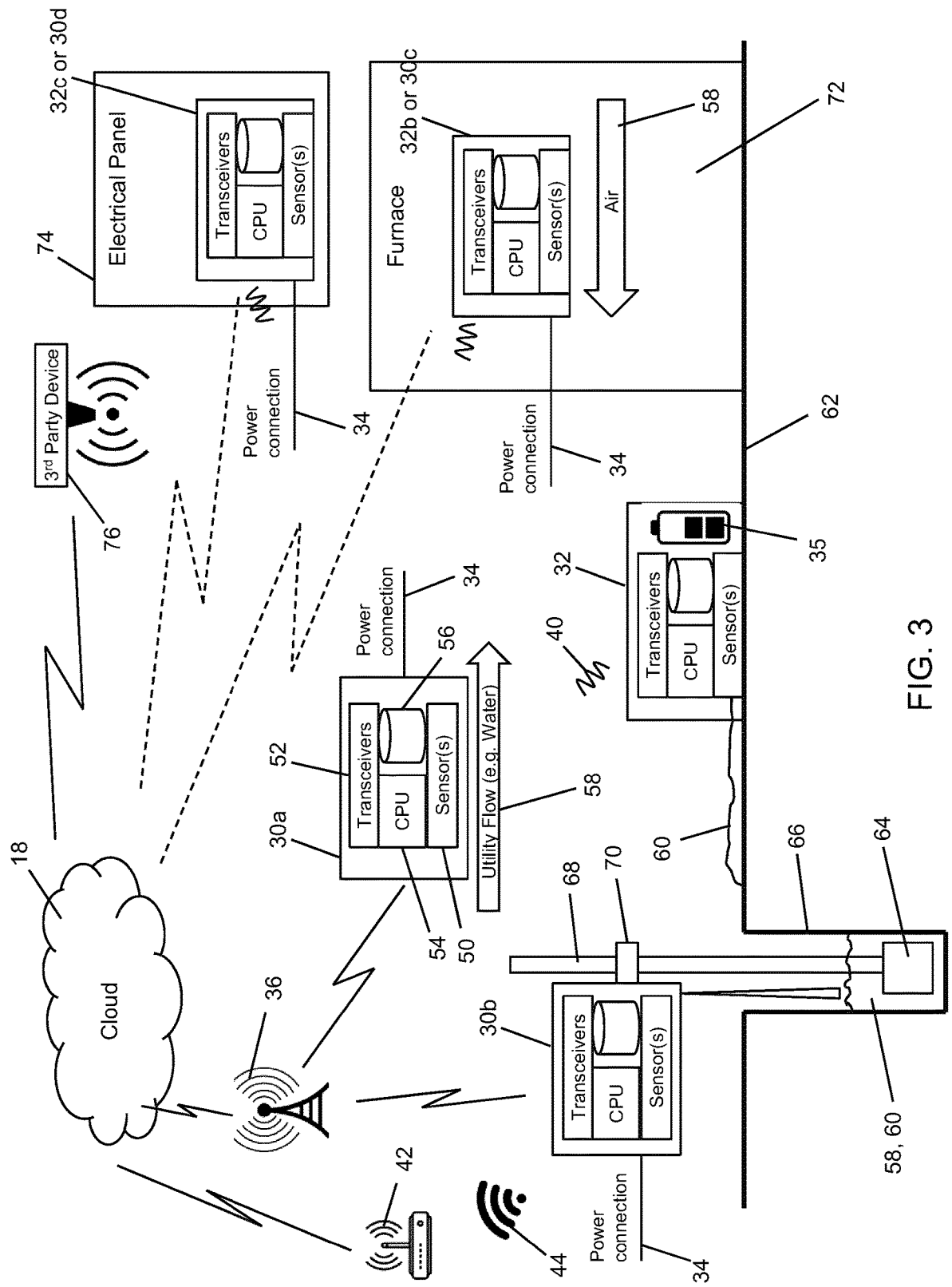
FIG. 3 is a schematic diagram of a basement-level monitoring system for an example dwelling.

FIG. 3 provides additional details of an example sensor system 12 at a monitored property 14 that is deployed at least primarily in a basement level of a premises. In this example, the sensor system 12 is deployed to primarily monitor water flow, water leakage, flooding, and to additionally monitor electrical and HVAC systems and third party devices. In FIG. 3, five different example sensor unit configurations are shown schematically, each with a similar hardware architecture, deployed within a particular mechanical configuration that is easy to install and initiate monitoring of a particular utility or output from the consumption of a utility. The similar hardware architecture, which is fully configurable and programmable for each application includes one or more sensors 50 for monitoring a particular utility or output from the consumption of a utility (e.g. heating and air conditioning), and optionally for monitoring other environmental factors such as temperature, pressure, air quality, audible alerts from $3^{rd}$ party devices 76 such as smoke and/or CO detectors, etc. The architecture also includes one or more transceivers 32 to provide one or more of the communication capabilities discussed above. It can be appreciated that which transceivers 32 are provided can dictate whether that particular unit can or will operate as a primary unit 30 or a secondary unit 30 (or either). The architecture also includes a central processing unit (CPU) 54 or other data processing capability, at least one memory element 56, and a power source such as a connection to an electrical outlet 34 and/or a battery 35. Each of the example sensor unit configurations shown in FIG. 3 will be described in turn below.

A primary unit 30a is shown in FIG. 3, which is configured to monitor a utility "flow" 58 such as a water source entering the monitored property 14 via a water meter. As will be explained in greater detail below, the primary unit 30a in this configuration includes a mechanical design that allows the primary unit 30a to be installed without altering the water meter or other structure that handles the utility flow 58, and thus is capable of performing its monitoring externally by being coupled to or otherwise interfaced with, for example, the water meter, on its exterior and incorporates sensor(s) 50 that can detect something changing or being altered within the water meter (or other utility device) without requiring tools for installation or a contractor to cut into existing lines, or modify the existing infrastructure. The CPU 54 is also configured to enable such monitoring with little or no set-up or initiation steps, e.g., such that by coupling the unit 30a to a water meter and turning the unit on, data can begin to be collected more or less immediately. As will be discussed later, the primary unit 30a would typically be registered with the cloud-based system 16 to enable it to begin sending data to the cloud 18. In this example, the primary unit 30a that measures the utility flow 58 includes at least one transceiver 52 that can connect to a cellular network 36 to send data to the cloud 18. The primary unit 30a also includes a power connection 34.

A secondary unit 32 is shown in FIG. 3, which is configured to detect the presence of unwanted fluid 60 by being placed on the floor 62 of the basement-level of the monitored property 14. The secondary unit 32 includes one or more sensors 50 such as conductivity contacts as explained later that are operable to detect the presence of such unwanted fluid 60, which can be indicative of a flood or spill. This secondary unit 32 is meant to act as an event detector rather than a continuous or periodic logging or monitoring device and thus can be operated for relatively long periods of time using one or more batteries 35.

As illustrated in FIG. 3, the secondary unit 32 includes at least one transceiver 52 that operates according to a short-range communication protocol to enable short-range communication capabilities 40 with the primary unit(s) 30 nearby. It can be appreciated that which primary unit(s) 30 the secondary unit 32 communicates with can vary depending on the number and location of devices in the sensor system 12. Moreover, the units 30, 32 can be programmed to have the primary units 30 receive data from any broadcasting secondary unit 32, or can be programmed to only receive data from certain secondary units 32. The choice of configuration can vary and only requires that the secondary unit 32 can get its data to the cloud 18 via an available path, preferably via one or more primary units 30. It can be appreciated that more than one of these secondary units 32 can be placed on the floor 62 or against the wall of the premises. For example, several of such secondary units 32 are advantageously placed throughout a room to provide suitable flood detection coverage. Since the secondary unit 32 in this example can lie on the floor 62 or be placed against a wall (see also FIG. 18 described below), "installation" is minimal, only requiring suitable placement and powering on. The secondary unit 32 may also require registration with the system so that any data communicated to the cloud 18 via a primary unit 30 can be associated with an account, premises, user, entity, service, etc.

Another primary unit 30b is shown in FIG. 3, which is configured to monitor a sump pump 64 operating in a sump well 66. Since a sump well 66 is normally used to collect water that naturally occurs, the monitored quantities can be considered both a flow 58 and a potential unwanted source of water 60, in particular if the levels are detected to be too high. In this example, it can be seen that this primary unit 30b includes a mounting apparatus 70 that is conveniently coupled to a sump pipe 68 that expels water from the monitored property 14. This allows the primary unit 30b to be positioned such that a proximity sensor is aligned with the sump well 66 to be able to detect the level of the water 58, 60 at any given time, the rate of change of this level, how quickly the sump pump 64 is able to expel the water (indicative of the health of the pump 64), etc.

As discussed later, the mounting apparatus 70 can be configurable into to multiple positions to accommodate different set-ups using the same device. This mounting configurability also enables any user to install the primary unit 30b without requiring specialized tools (or even tools at all), and without requiring a contractor or service in order to set up the unit 30b. By having the primary unit 30b registered with the cloud-based system 16, after being installed and turning on the unit, monitoring can begin without requiring any complicated installation steps or pairing with existing network, etc. It can be appreciated that while FIG. 3 illustrates the secondary unit 32 in communication with the primary unit 30a, the secondary device 32 could also (or instead) provide its alerts and/or data to the other primary unit 30b. FIG. 3 also illustrates that while preferably connected directly to the cloud 18 via, for example, a cellular network 36, the primary unit 30b could also or instead utilize a Wi-Fi connection 44 to provide a communication path to the cloud 18.

FIG. 3 also includes two additional utility-related devices, namely a furnace 72 that consumes a utility and provides an output to the monitored property 14 in the form of heated or cooled air, and an electrical panel 74 that distributes a source of electricity from an electrical utility into the monitored property 14. In both cases, primary or secondary units 30, 32 are affixed or otherwise positioned on or relative to the furnace 72 and panel 74. Preferably, the units 30, 32 are detachably coupled to a metallic surface using internally placed magnets (see also FIGS. 19 and 20 described below). In this way, the units 30, 32 can be quickly coupled to the monitored appliance/panel in a simple way that does not require modifications to the appliance/panel or a contractor to do so. Given the number of and types of units 30, 32 shown in the example sensor system 12 in FIG. 3, the furnace and electrical panel monitoring devices are illustrated as being secondary units 32b, 32c but also capable of being primary units 30c, 30d. It can be appreciated that the CPUs 54 and transceivers 52 in such units 32b, 32c can be programmed to send data over a local communication capability 40 to send data via one of the primary units 30a, 30b, or can be programmed to communicate with the cloud 18 directly, e.g., via a cellular network 36. The devices 32b, 32c can also be registered with the cloud-based system 16 prior to installation and being powered on.

The CPU 54 and sensors 50 of either or both primary and secondary units 30, 32 can also be programmed and provisioned to be able to detect various other data in the environment, including ambient conditions like temperature, pressure, air quality, humidity, etc., and also the presence and operation of $3^{rd}$ party devices 76 such as smoke and/or CO detectors. As illustrated in FIG. 3, such $3^{rd}$ party devices 76 may themselves be connected devices that communicate with $3^{rd}$ party systems and services in the cloud 18.

Figure 4:
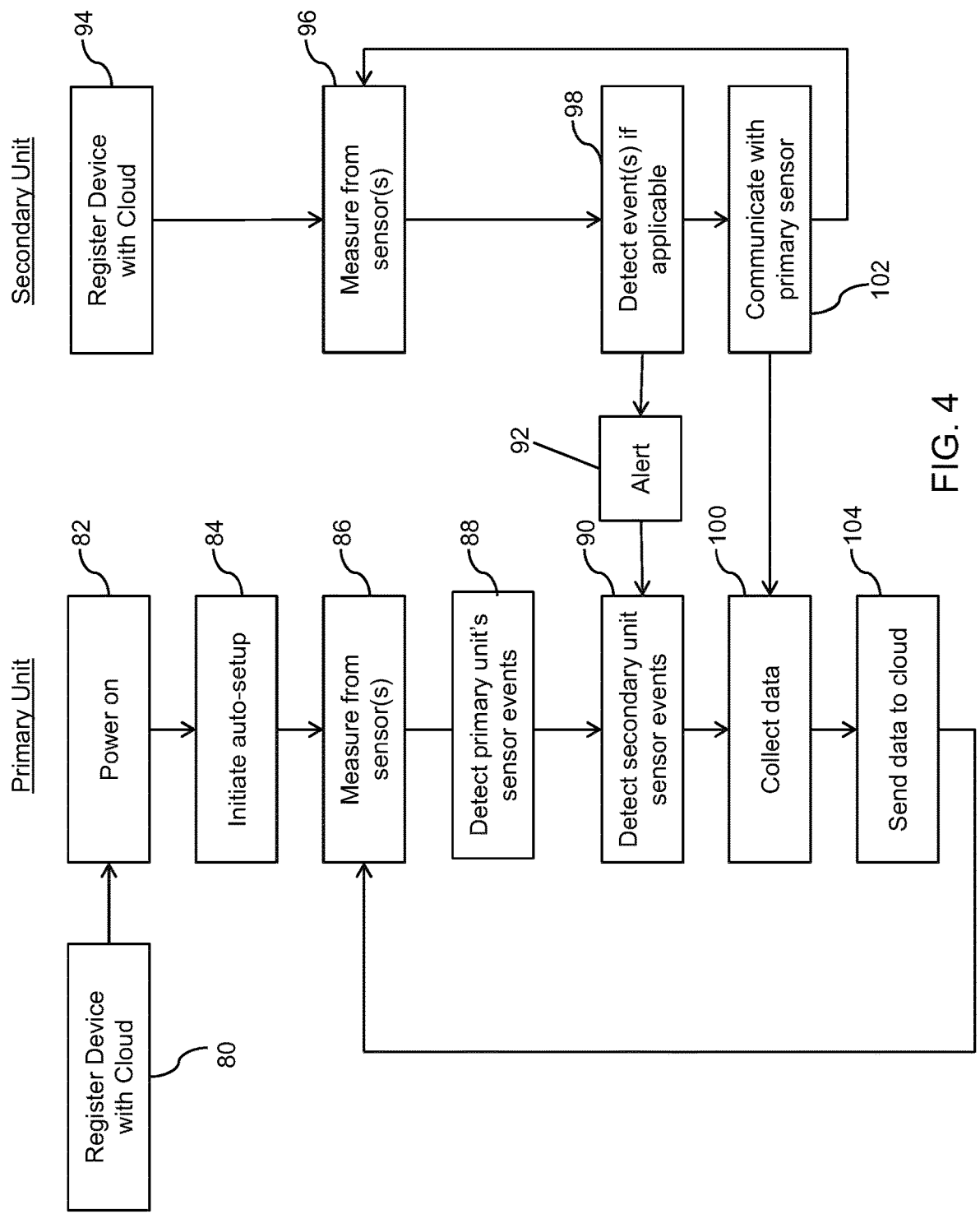
FIG. 4 is a flow chart illustrating computer executable operations performed in operating a system of sensor units to monitor a property.

FIG. 4 provides a flow chart illustrating example computer executable operations that can be performed in gathering data from primary and secondary units 30, 32 and sending such data to the cloud-based system 16 via one or more connections to the cloud 18. At step 80, a primary unit 30 is registered with the cloud-based system 16 to enable a cellular (or other long-range) connection to the cloud 18 to be established and for the cloud-based system 16 to be able to identify the particular unit 30 and correlate or map it to its corresponding sensor system 12, owner, premises, etc. Between steps 80 and 82, it is assumed that the primary unit 30 has been installed on the corresponding device that carries and/or meters the utility being monitored, e.g., a water meter, electrical panel 74, sump well pipe 68, furnace 72, etc. The primary unit 30 may then be powered on at step 82. This initiates an auto-setup within the CPU 54 and sensors 50, e.g., to detect and correct for ambient noise, to calibrate the unit 30 according to characteristics of the device onto which the primary unit 30 is installed (e.g., the strength of the rotating magnets in a water meter), etc. The primary unit 30 then begins to obtain measurements from the one or more sensors 50 in the unit 30. At step 88, the primary unit 30 detects its own events, if applicable at that time, and at step 90 detects any sensor events being broadcast by a secondary unit 32 at step 90, by receiving one or more alerts 92 from the secondary unit 32.

After the primary unit 30 is set up, and can receive and send data, one or more secondary units 32 can also be registered with the cloud-based system 16 at step and begin obtaining measurements from one or more sensors at step 96. For example, a flood detection secondary unit 32 may be positioned on the floor 62 and when provided with power can begin obtaining measurements from one or more sensors at step 96. For event-triggered devices such as the flood detection secondary unit 32 shown in FIG. 3, step 96 may simply include having a pair of contacts powered such that they are able to detect the presence of a fluid across the contacts and only detect an event at step 98 and report an alert 92 when that occurs. For secondary units 32b, 32c that perform ongoing monitoring and logging, events may occur at various times for various reasons (e.g., a surge in electricity, a large increase or decrease in air temperature, etc.) and can be detected at step 98 and reported at step 92 at the appropriate time. Such secondary units 32 may also communicate with the primary sensor 30 periodically to provide the data that it has logged. That is, the secondary units 32 can be configured to report either or both alerts and logged data to a primary unit 30.

The measurements taken by the primary unit 30 and received from the secondary unit(s) 32 are collected at step 100 and this data is sent to the cloud 18 at step 104. It can be appreciated that the data can be sent in real-time as it is collected or periodically in chunks of data. Since the primary unit 30 can be connected to the cloud 18 via a two-way connection, e.g., via a cellular network 36, the primary unit 30 may optionally be pinged by the cloud-based system 16 in order to provide updates.

Figure 5:
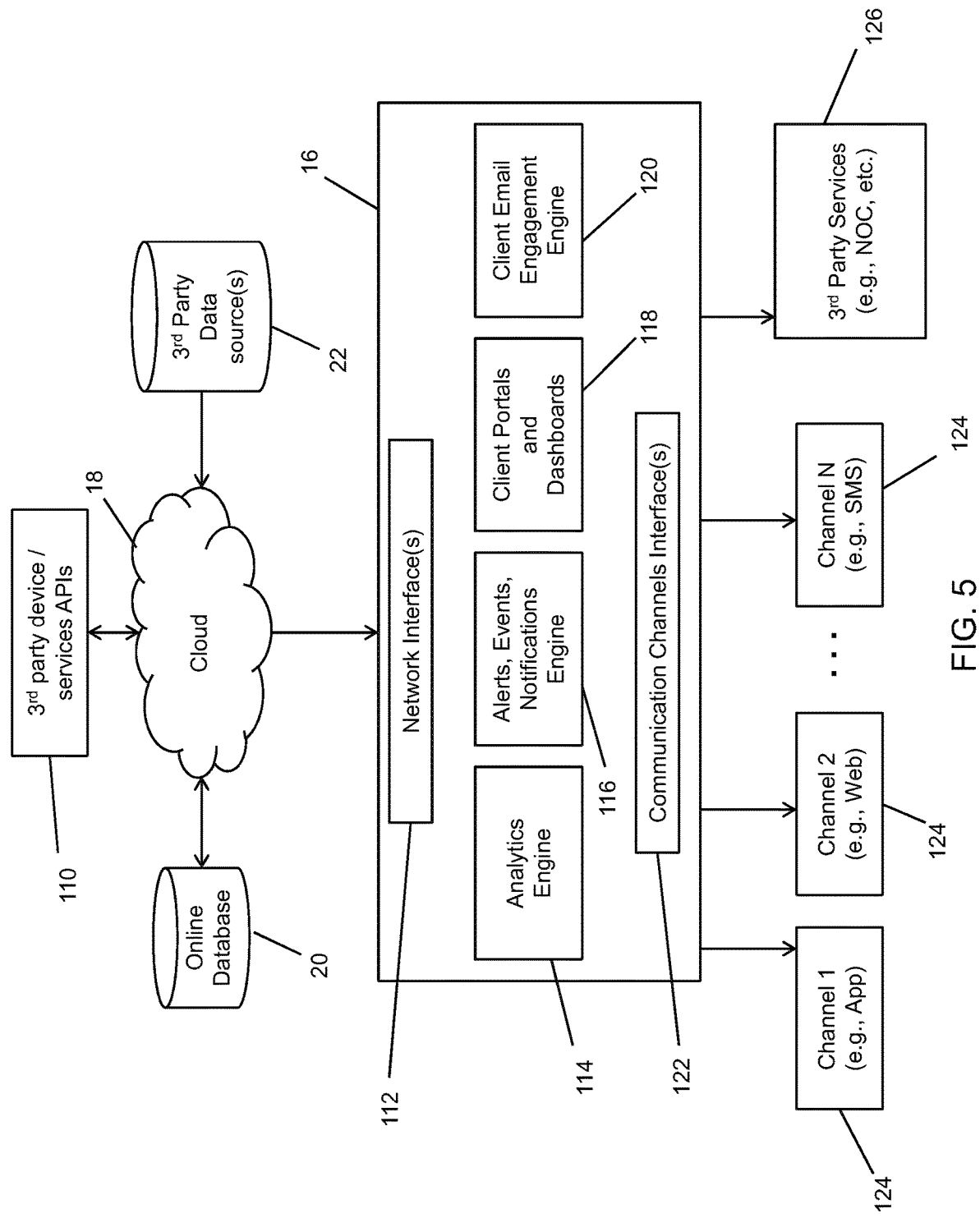
FIG. 5 is a schematic diagram of a cloud-based system for analyzing data obtained from monitored properties and providing notifications and alerts to registered user devices.

Further detail concerning the cloud-based system 16 is shown in FIG. 5. Turning now to FIG. 5, the cloud-based system 16 includes one or more network interfaces 112 that enable it to receive data from the sensor systems 12 via the cloud 18, and to interface with the online database 20, $3^{rd}$ party data source(s) 22, and any other $3^{rd}$ party device/service APIs 110 that have been provided to interact with $3^{rd}$ party devices and services such as connected smart home devices, electronic personal assistants, home monitoring services, etc.

The cloud-based system 16 can be used to not only collect the data from the sensor systems 12 but also present, interpret, and act upon that data. For example, as shown in FIG. 5, the cloud-based system 16 can include an analytics engine 114 to perform analytics on both individual data for a particular client/customer, and pools of preferably anonymized data collected from many individuals and locations. In this way, the data that is collected can be interpreted in meaningful way to show usage trends, detect events, generate warnings, recommendations, or preventative maintenance tips, etc. An alerts, events, and notifications engine 116 is used to detect or be informed of detected events, and prepare suitable alerts and/or notifications. A client portals and dashboards module 118 is used to host and make available various portals and dashboards for interacting with the cloud-based system 16 (e.g., to register a device), and for viewing and interpreting the data that is collected (e.g., by viewing statistics, reports, recommendations, etc.). A client email engagement engine 120 is used to extract actionable information from the user's data, and provides an email-based output from the analytics engine 114. The cloud-based system 16 also includes one or more communication channel interfaces 122 for communicating with users via one or more channels 124, e.g., apps, web, SMS, email, etc. The communication interface(s) 122 also enable the cloud-based system 16 to interact with $3^{rd}$ party services 126 such as network operating centers (NOCs) for allowing other systems to receive and act on conclusions drawn from the analytics engine 114. For example, a system that coordinates maintenance for one of the monitored properties 14 could interface with the cloud-based system 16 to determine when to automatically issue service tickets and/or schedule maintenance based on information from the system 16. Such $3^{rd}$ party services 126 can also be given a dashboard to allow them to review, analyze and act on the data generated by the system 16 for a particular entity or entities.

Figure 6:
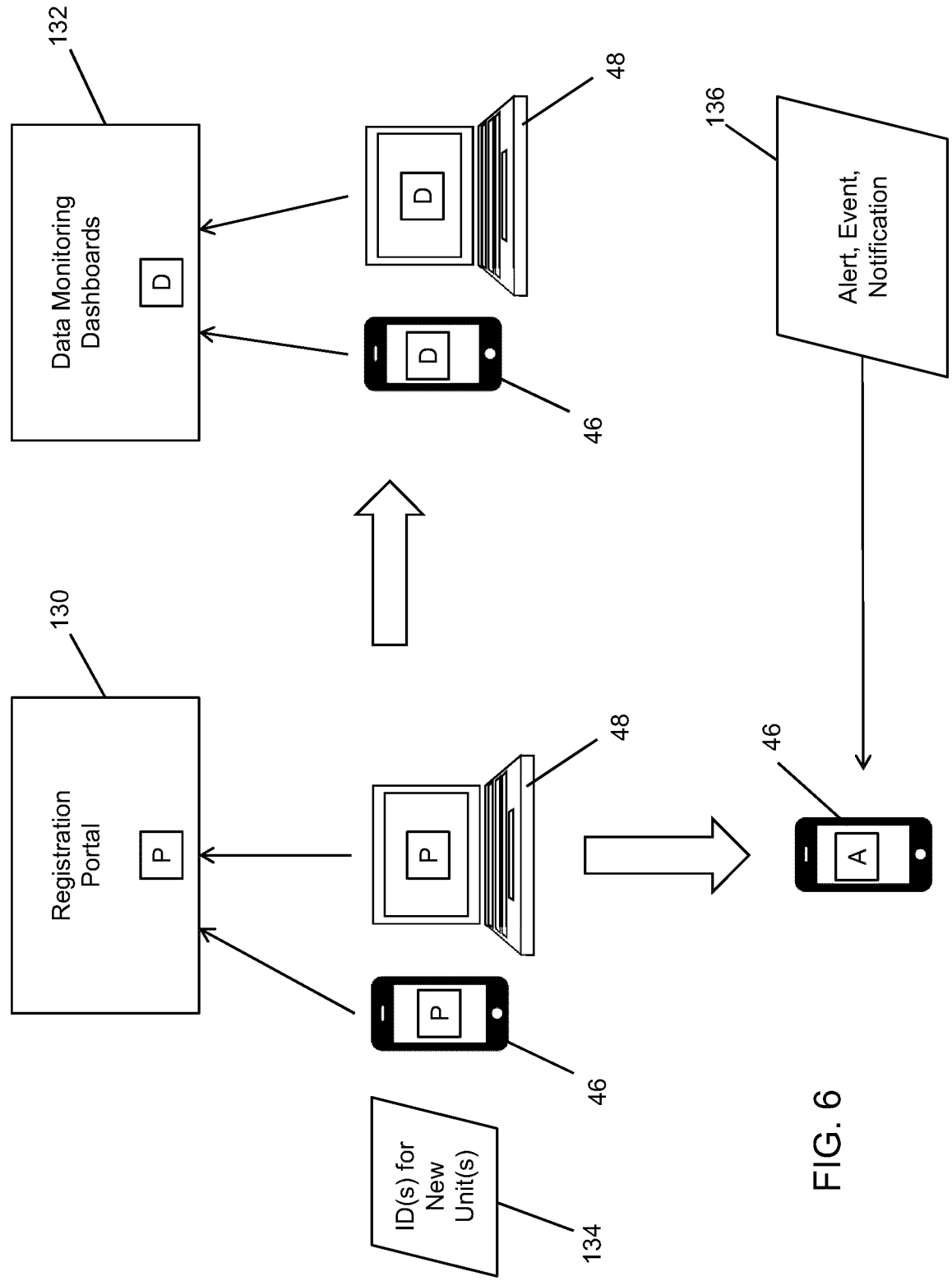
FIG. 6 is a schematic diagram of a user-device interacting with a registration portal, a data monitoring dashboard, and receiving an alert, event or notification.

FIG. 6 illustrates some example interactions between user devices 46, 48 and the cloud-based system 16. As indicated at steps 80 and 94, the cloud-based system 16 may require that the primary and secondary units 30, 32 be registered before being able to connect into the system 16. A registration portal 130 can be provided, which provides a user interface (e.g., hosted website P) that can be accessed using any internet connection. This allows the user or entity to register and create an account for that user or entity and to create profiles for one or more properties that will be monitored. Once registered with the system 16, the user or entity can add primary or secondary units 30, 32 by providing unique identifiers (IDs) 134 that are associated with the units 30, 32. In this way, the primary units 30 can be programmed to automatically access, for example, a cellular network 36 and make itself know to the cloud-based system 16, and the IDs 134 matched to associate the logged data and events with the particular user or entity. As shown in FIG. 6, this can be done using a mobile device 46 or other computing device 48.

After registration, the cloud-based system 16 can provide data monitoring dashboards 132 for each registered user to allow that user or entity to view the data being collected by its devices. This allows, for example, water consumption trends to be viewed and potentially remedial action taken according to the data observed. Other scenarios can be detected, such as spikes in water usage when there are no occupants at the monitored property 14, e.g., due to theft of water occurring via an external hose pipe. Such dashboards D can be viewed and interacted with via a web-based interface or an app or widget, to allow any device 46, 48 with an internet connection to be used.

After registration of one or more units 30, 32, the user may also receive alerts 136 or other details concerning events or notifications that would necessitate a real-time or dedicated message. In this example, the alert 136 is sent to a mobile device 46, e.g., via an app or SMS message, but could also be sent via email to other electronic devices 48 such as a home or work PC.

In order to provide an easy installation process that minimizes interference with the devices or systems being monitored, and enables anyone to install the units 30, 32 without the need for a contractor or special tools, each unit 30, 32 has a particular mechanical configuration that enables non-invasive monitoring with an easy to apply coupling mechanism to position the sensor(s) 50 in the appropriate location relative to what is being monitored inside the device or system.

Figure 7:
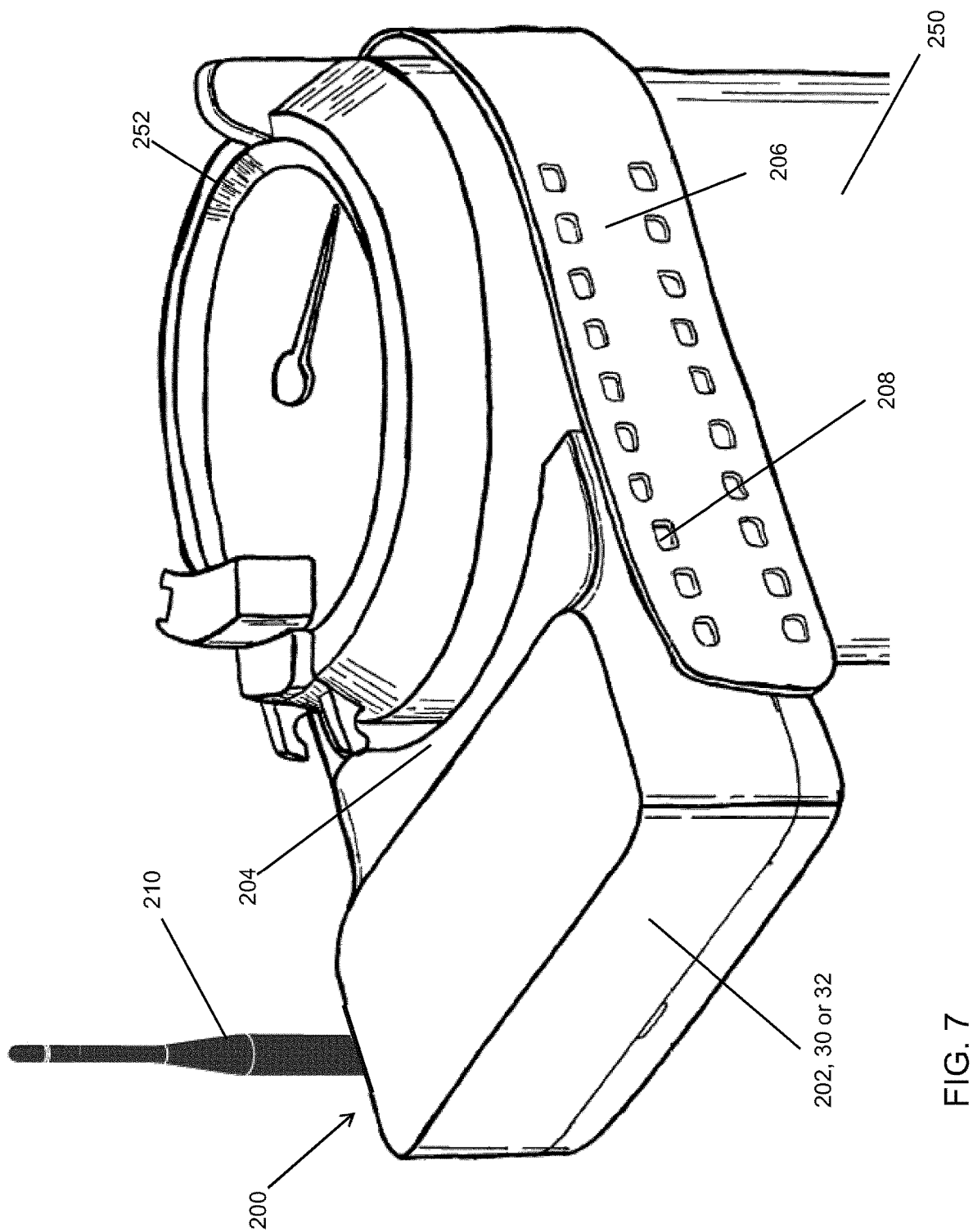
FIG. 7 is a perspective view of a sensor unit coupled to a water meter for monitoring water flow and performing leakage detection.

FIG. 7 illustrates a water flow monitoring unit 200 that is coupled to a water meter 250. The water flow monitoring unit 200 includes a housing 202 that includes a contoured portion 204 that generally corresponds to, or is compatible with an exterior surface of the water meter 250 that is aligned with the rotating internal magnet. This allows the housing 202 to be "strapped" to the water meter 250 about its girth without obstructing the readable display 252 that faces upwardly. In this way, the unit 200 is positioned on the water meter 250 in alignment with the rotating internal magnet, allowing water flow through the water meter 250 to be measured, without disrupting the normal operations of the water meter 250 and without requiring the water lines to be cut into or otherwise modified. That is, the unit 200 is passively attached to a water supply system and can measure any water flow in a water system. Thus, the unit 200 can calculate water consumption and detect leaks in the water supply system including very small leaks quickly and accurately by monitoring the water flow and analyzing the flow in comparison to typical water consumption patterns. By connecting to the cloud-based system 16, such analyses can be performed and reported back to the user.

A strap 206 is provided that is sized to extend about the girth of the water meter 250 as shown in FIG. 7 and attaches to a suitable coupling mechanism 208 on the opposite side of the housing 202. The strap 206 is advantageously made from a rubberized material to provide some resiliency and should be adjustable to accommodate water meters 250 of different sizes. In this example, a series of notches are incorporated into the strap 206, which interface with teeth or other protrusions to provide an adjustable coupling mechanism 208. The water flow monitoring unit 200 also includes a cellular antenna 210 that can be adjustable to find a suitable cellular signal. Status lights and a power outlet (not shown) may also be incorporated into the housing 202. Data ports and other input/output (I/O) interfaces can also be incorporated into the housing 202 to enable upgrades and updates to be performed.

Figure 8:
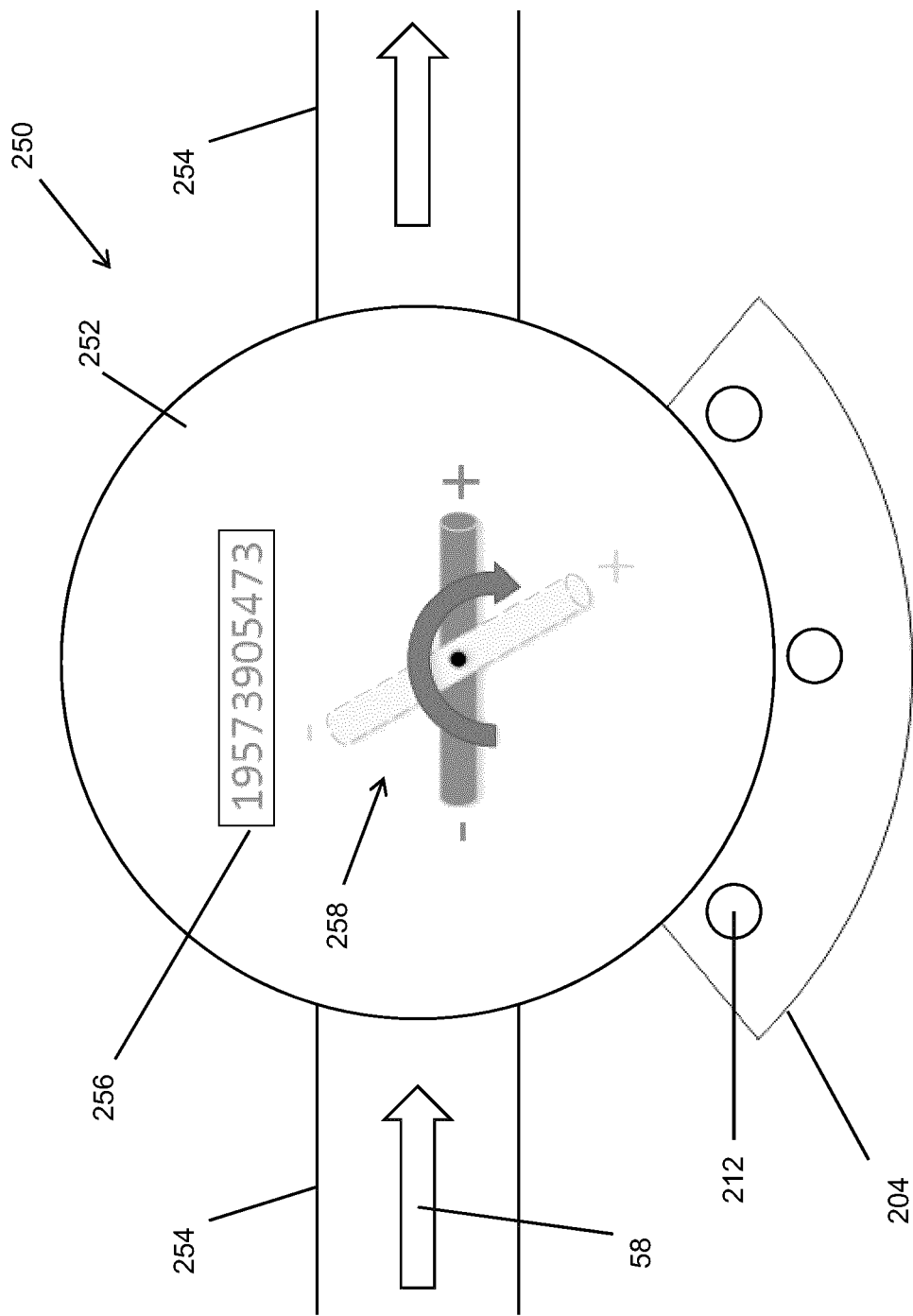
FIG. 8 is a schematic plan view of a water meter being monitored by an array of magnetic sensors in the sensor unit shown in FIG. 7.

The portion 204 of the housing 202 when installed against a water meter 250 is shown schematically in FIG. 8. The primary unit 30 contained in the housing 202 includes a number of magnetic sensors 212 (e.g., hall effect sensors) that are connected to a control board (CPU 54) which are used to accurately monitor the rotation of the magnetic core 258 within the water meter 250. As indicated above, attaching the unit 200 to the water meter 250 is done in a passive operation and does not affect the functioning of the existing water meter 250 or the plumbing 254. The water flow 58 through the meter 250 can therefore be measured by monitoring the rotation of the magnetic core 258 using the magnetic sensors 212.

The unit 200 may include a multitude of sensors 212 as shown in FIG. 8. Since the strength of the signal can be greatly reliant on the placement of the sensor 212 relative to the water meter's magnetic core 258, multiple sensors 212 along the water meter 250 can significantly reduce the need for careful placement of the unit 200 on the water meter 250 which can greatly facilitate installation and avoid inoperable units 200 post-installation. Once the unit 200 is placed on the water meter 250, the CPU 54 could either select a single sensor 212 as the best signal available, or use some combination of multiple signals received from multiple sensors 212 together to more reliably detect each turn of the magnetic core 258.

Figure 9:
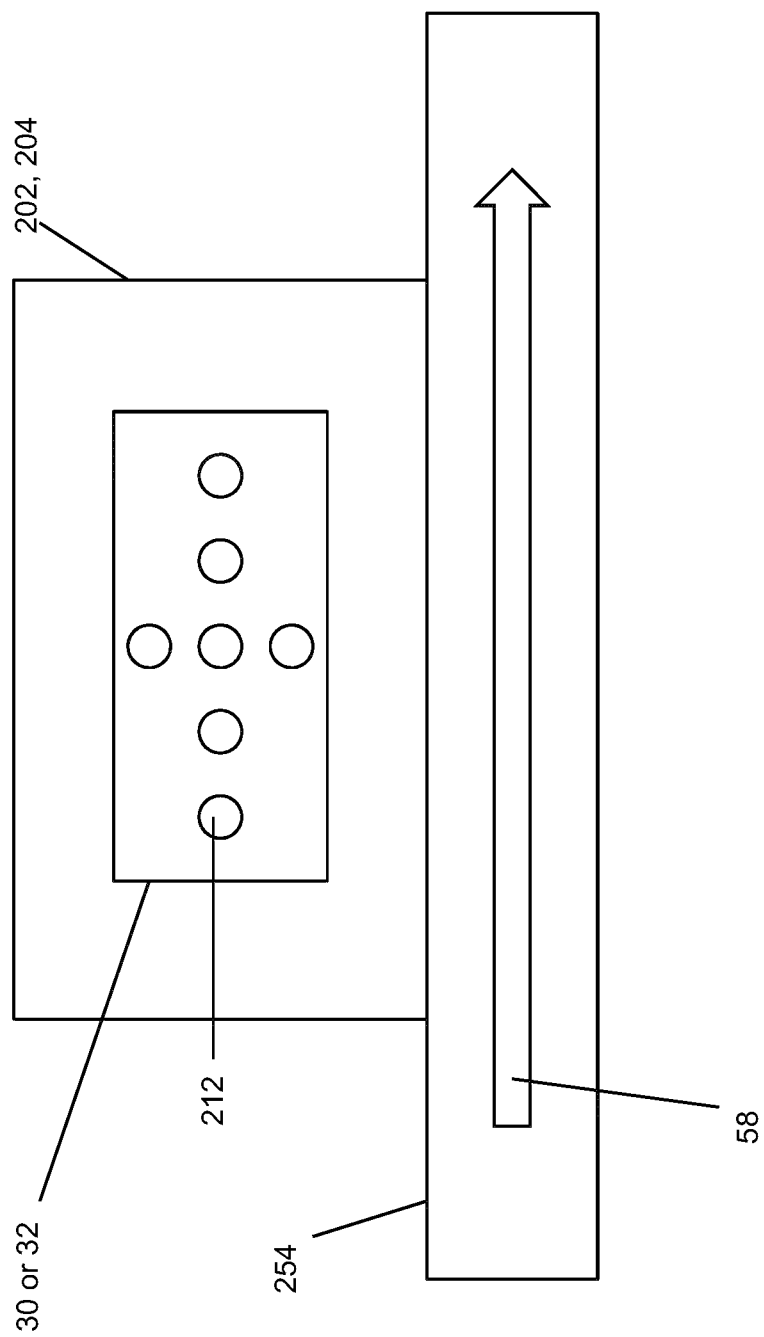
FIG. 9 is a schematic elevation view showing a multi-dimensional array of magnetic sensors used for monitoring a water meter.

As shown in FIG. 9, the unit 200 may also include a multitude of sensors 212 arranged vertically to not only reduce the need for careful placement, but by simple summing of the signals will tend to constructively add in the phase magnetic signal. This will tend to remove noise and offset variations from different sensors to greatly improve the sensitivity of the system and increase the signal to noise ratio. The unit 200 may include a multitude of sensors 212 that are arrayed horizontally along the surface of the water meter 250. The horizontal placement allows the CPU 54 to be able to better characterize the motion of the magnet by capturing the magnet in a variety of orientations as it rotates within the meter. Both vertically and horizontally arrayed sensors 212 can also be used together as illustrated in FIG. 9.

Since the unit 200 is attached externally to the water meter 250, the signal to be detected from the magnetic core 258 can be small, in some cases as low as 1 Gauss or about twice the ambient magnetic field of the Earth. To account for potentially weak signals such as this, the CPU 54 can be programmed to control noise. Since noise may be within the same order of magnitude as the signal itself, amplification of the raw signal could produce unpredictable results that may not result in accurate readings of the water meter 250. In applications such as this, a high pass filter can be used to remove noise caused by offset in the magnetic sensor itself as well as noise introduced by the ambient magnetic field, however a high pass filter will also risk the removal of low frequency signals such as those that would be created by very low flow through the meter.

Figure 10:
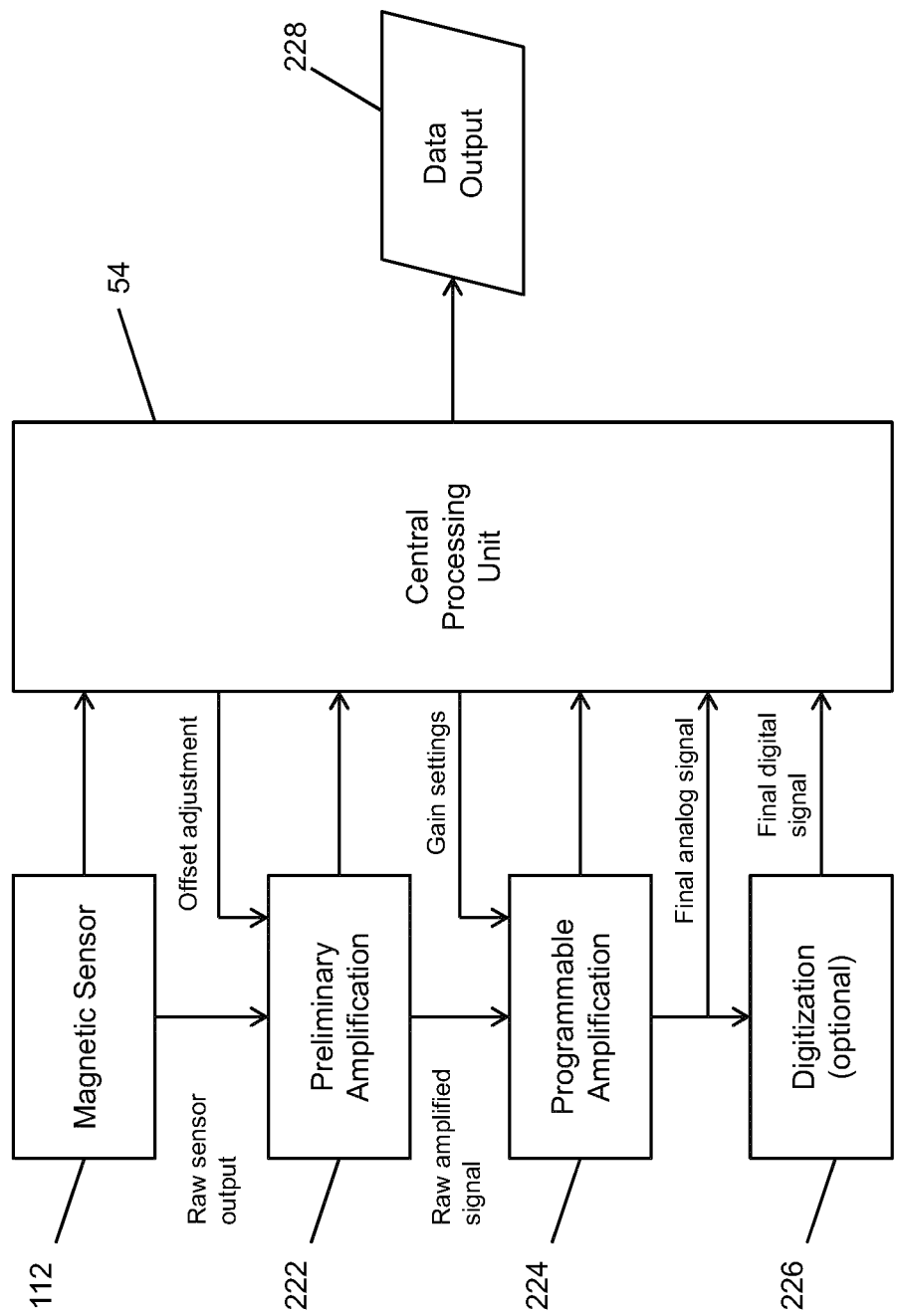
FIG. 10 is a block diagram of a process for automatically calibrating a water meter monitoring sensor unit.

Rather than using a high pass filter, for the CPU 54 to accurately read water consumption, the raw signal should be maintained without passing through such a high pass filter, and instead compensated for by an intelligent feedback system which will more dynamically separate noise from the signal. Such an intelligent feedback system works by sampling values at various points in the process to determine the correct offset value to remove noise from the signal without removing low frequency sources. FIG. 10 outlines a multi-stage system where the original signal from the magnetic sensor(s) 112 is provided to both the CPU 54 and a preliminary amplification stage 222, which is a static amplification. The CPU 54 determines a suitable offset adjustment for the preliminary amplification, which generates a raw amplified signal that is fed into a programmable amplification stage 224 that incorporates gain settings provided by the CPU 54. The final analog signal can be used, or optionally digitized at 226 to generate a final digital signal. The CPU 54 may then generate one or more data outputs 228.

The signal may therefore be passed through two amplifiers—first a static, then a dynamic amplification stage. This may be performed in a single dynamic amplification as well depending on the availability of a suitable programmable amplifier. One method to separate noise from the signal is to introduce a calibration stage where the CPU 54 is programmed to configure the offset adjustment seen in FIG. 10 before being attached to the water meter 250. When this calibration occurs, the CPU 54 can converge on an offset adjustment, which results in a signal equal to the output of the magnetic sensor 112. The preliminary amplifier 22 may then subtract the sensor output from the offset adjustment to result in the amplification of a noise-reduced signal.

Another method to separate noise from signal is to add logic to the CPU 54 that provides the capability of determining when water is running and when it is not. The CPU 54 could then use the "off" period to automatically calibrate its zero point and configure the feedback mechanism to minimize noise. Yet another method to separate noise from the signal would be to add a continuous calibration step which will keep the signal within acceptable bounds by continuously adjusting the offset voltage. Yet another method to separate noise from the signal is to add logic to the CPU 54 that determines when water is running, and calibrate the zero point of the system knowing that the magnet 258 is spinning at a regular rate, and to calibrate based on the knowledge that the noiseless signal is a regular wave pattern centered on zero.

The sensor system 12 can also be configured to monitor water flow on an unmetered system (or branches from a single meter 250) that can be installed without requiring any changes to the existing water supply system or professional services. In this configuration, water flow is monitored using one or both of an audio or vibration sensor which can detect from outside the system and perform a frequency domain analysis of the sound to separate ambient noise from water flow even with very small amounts of water flowing through the pipe.

Figure 11:
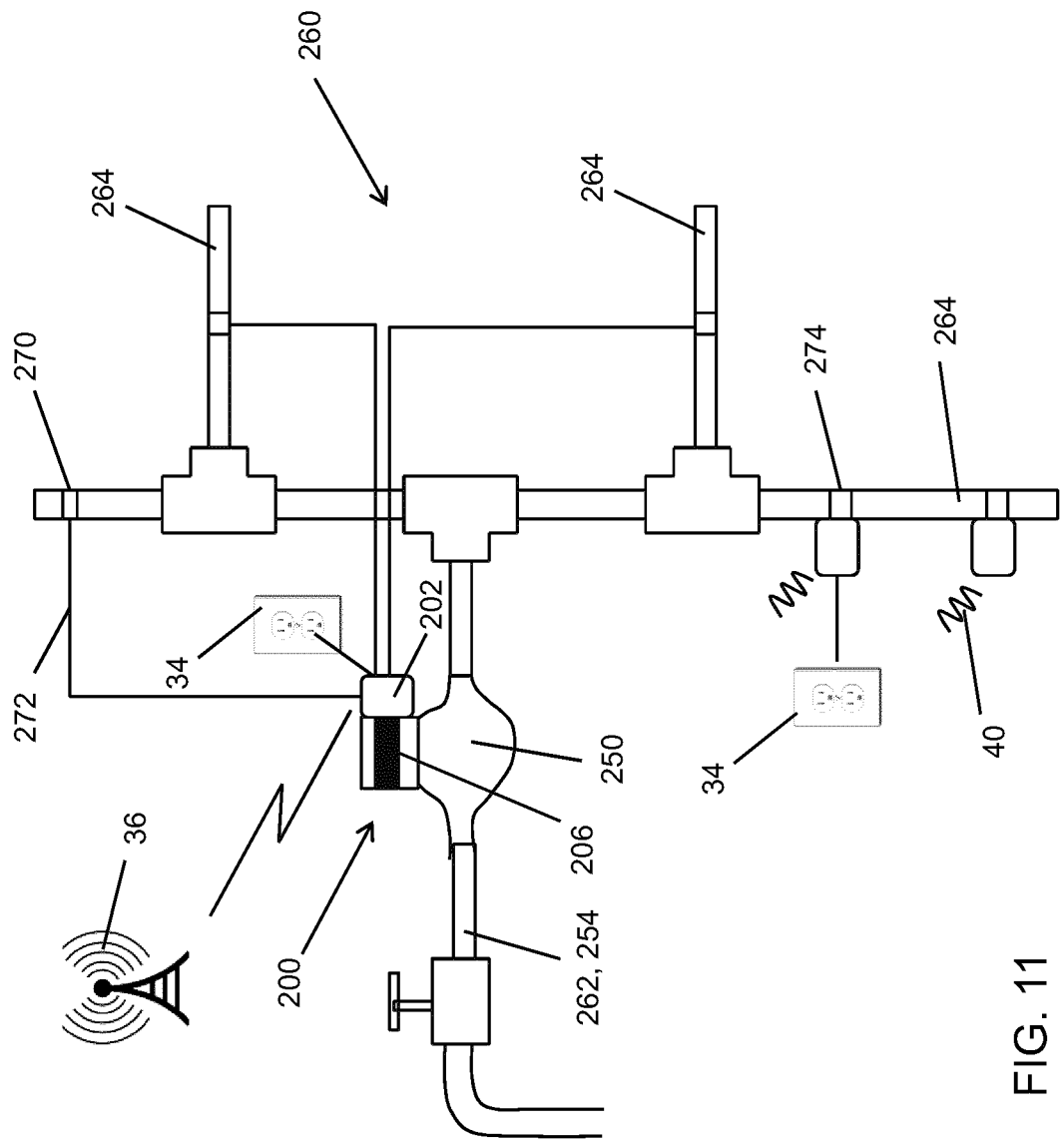
FIG. 11 is a schematic diagram of a multi-branch water supply being monitored by a set of sub-metering sensor units.

An example of a branched water supply system 260 is shown in FIG. 11. In the arrangement exemplified in FIG. 11, the water source 262 feeds the plumbing 254 that passes through a water meter 250 and measures the overall water flow for that "utility account". The water flow monitoring unit 200 is installed externally to the water meter 250, connected to an electrical outlet 34, and communicable with a cellular network 36 as described above. In this example, the main water line divides into multiple branches 264. While in a regular household or place of business, this would simply correspond to directing water to different areas of the monitored property 14, the branches 264 may in some scenarios correspond to water supply lines for different units with the same household or commercial building. Even within a same household, the owner may wish to know about water consumption or pinpoint leaks within different areas of the home, to provide additional intelligence. The unit 200 can be interfaced with various sub-sensors, which are configured to monitor flow through specific portions of the plumbing system in conjunction with the primary unit 200 monitoring overall flow of water. In this example, a series of wired sensors 270 are connected to the unit 200, and a pair of wireless sub-sensors 274 are communicably connected to the unit 200. As shown in FIG. 11, the wireless sub-sensors 274 can be powered by an electrical output 34 or be battery operated, depending on whether the sub-sensors 274 are continually or periodically collecting data or being used as shut offs (e.g. by controlling shut-off valves or other shut-off mechanisms. These sub-sensors 270, 274 could be audio or vibration sensors that provide signals that can be interpreted by the CPU 54 of the main unit 200 to determine water flow and events happening on the corresponding branch 264. The sub-sensors 270, 274 can be considered secondary sensors 32 in the context of what is shown in FIGS. 2 and 3 described above.

Accordingly, the system 10 can be used to accurately characterize water flow in either a metered or unmetered system with a sensor system 12 that can be installed without any training or experience with water systems and will automatically calibrate itself to the magnetic signal and correct for ambient noise.

Figure 15:
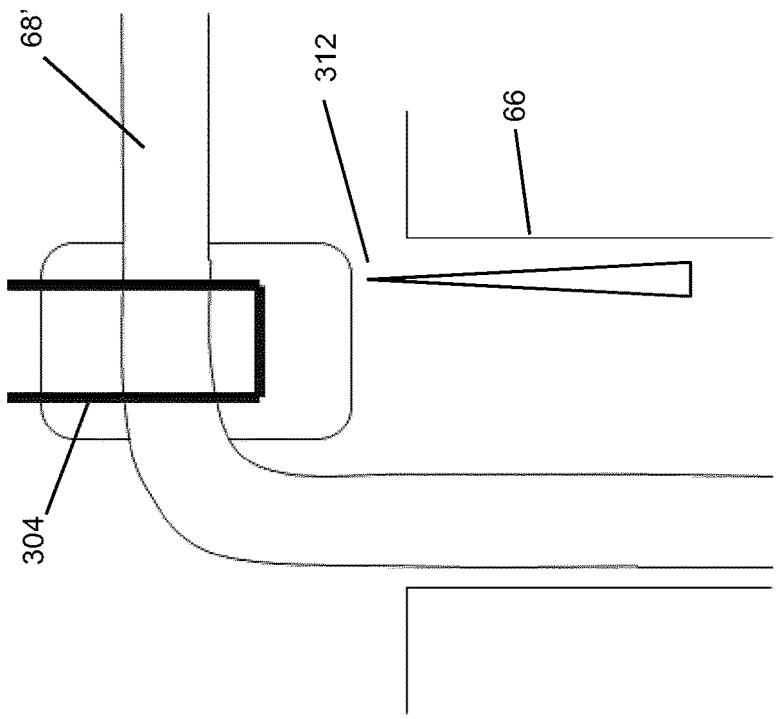
FIG. 15 is a schematic elevation view of the sensor unit of FIG. 12 mounted to a horizontally-oriented length of pipe.
Figure 14:
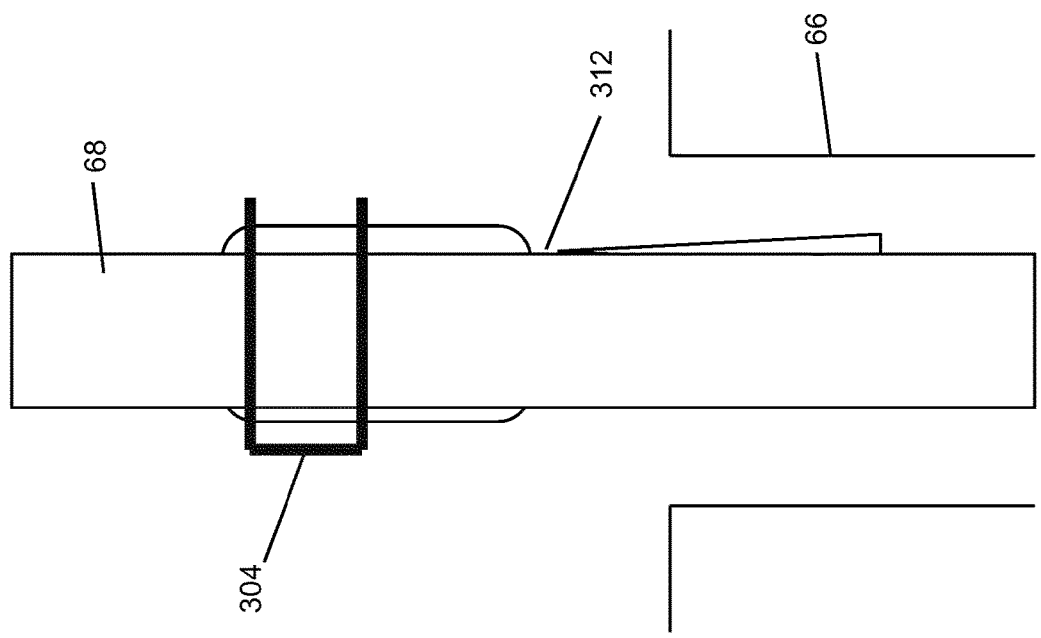
FIG. 14 is a schematic elevation view of the sensor unit of FIG. 12 mounted to a vertically-oriented length of pipe.

FIGS. 12 and 13 illustrate a water level monitoring unit 300 that includes a preferably water proof housing 302 that contains the primary or secondary unit 30, 32 described above. The housing 302 includes a flanged protrusion 306 that interfaces with a rotatable clamp 304 for securing the unit 300 to a pipe or other structure. The clamp 304 includes a pair of loops, one that is sized to seat in the flanged protrusion 306 such that the resiliency of the clamp 304 allows the clamp 304 to be rotated in 90 degree increments as illustrated in dashed lines in FIG. 13. The housing 302 can include a power port 310 and an antenna port 308 for installing an antenna similar to the antenna 210 shown in FIG. 7. It can be appreciated that the double-looped style of clamp is only illustrative, and other rotatable clamps could be incorporated into the unit 300 to allow a proximity sensor (not shown) to be oriented relative to the structure to which the unit 300 is being clamped. For example, FIG. 14 shows the clamp 304 secured to a vertically oriented pipe 68 extending out from a sump well 66, which is rotated 90 degrees relative to the body 202 to maintain the downwardly directed orientation of the proximity sensor 312. As shown in FIG. 15, by rotating the clamp 304 about the flanged protrusion 306 (see also FIG. 13), the clamp 304 can be affixed to a generally horizontally oriented pipe 68' to maintain the downwardly directed positioning of the proximity sensor 312.

The rotatable clamp 304 also allows the unit 300 to be used in other applications. For example, as shown in FIG. 16, the clamp 304 can be inserted over the upper edge of a vessel 320, such as a water softener tank. This allows, for example, the salt levels 322 to be monitored using the same unit 300 that can monitor water levels in a sump well 66.

The body 302 can also be configured to allow the unit 300 to be fastened to a substrate rather than using the clamp 304. For example, FIGS. 17A and 17B show a housing 302 having a main portion 302*a* and a mounting portion 302*b* that are securable to each other to contain the hardware components. By separating the portions 302*a*, 302*b* as shown in FIG. 17A, the mounting portion 302*b* can be screwed or otherwise fastened at location 332 to a substrate such as a lid 330 for a vessel 320 or sump well 66. In the example shown in FIG. 17, the mounting portion 302*b* is secured to the upper side of the lid 330 to align the proximity sensor 312 with an aperture in the lid 330. However, it can be appreciated that the proximity sensor 312 could be located at the opposite end of the main housing portion 302*a* and the mounting portion 302*b* secured to the underside of the lid, which may be required if no aperture exists in the lid 330.

FIG. 18 illustrates a flood monitoring unit 400 that can be placed against a floor 62 or wall 410 in order to detect the presence of fluids caused by spills or flooding, e.g., on a basement floor 62. The unit 400 includes a preferably waterproof housing 402 that contains a secondary unit 32 that is configured to communicate with a primary unit 30. The flood monitoring unit 400 may be programmed and deployed as an event-triggered device to allow it to be battery operated. Since the flood monitoring unit 400 is meant to detect spills or floods, it may be important to avoid any power connections to/from the units 400. As illustrated best in the left-most unit 400 in FIG. 18, the housing 402 can be provided with a slightly contoured underside 406 to maintain a small gap between a pair of contacts 404 used to sense the presence of fluid 60, and the surface of the floor 62. This avoids the contacts 404 coming in to direct contact with the floor 62 thus avoiding false positive alarm conditions. As illustrated in the rightmost diagram in FIG. 18, the unit 400 can also be affixed to a wall 410 or baseboard using an adhesive strip 408. Since the contacts 404 are exposed about multiple surfaces that are normal to each other, the unit 400 can be used in multiple orientations. When seated on the floor 62, the unit 400 should not be propped up as illustrated in the middle diagram in FIG. 18 to avoid the contacts 404 being placed too high relative to the floor 62 or for being obstructed by the adhesive strip 408 itself. The unit 400 is therefore easy to install without requiring any tools or custom installations/modifications to the monitored property 14. Also, an mentioned above, multiple units 400 can be deployed in the same sensor system 12 to provide suitable coverage for a particular area or areas. (e.g., basement with multiple below-grade levels).

FIG. 19 illustrates an HVAC monitoring unit 500 that can be magnetically (or otherwise readily (and preferably releasably secured) to/on an HVAC duct 520 extending from a furnace 72. Since the HVAC ducts typically carry both heated and (if available) cooled air throughout a force-air system, the unit 500 can monitor not only the operations of the furnace 72 but also an air conditioning unit and/or humidifier that is feeding air into the duct 520. In the schematic representation shown in FIG. 19, a plurality of internally positioned magnets 504 allow the unit 500 to be magnetically affixed to the duct 520 in order to make contact between an exposed temperature probe 506 and the wall of the duct 520 to be able to measure temperature and temperature changes for the air passing through the duct 520. It has been found that since appliances such as furnaces 72 tend to be considered complicated and intimidating to most users, existing tools and devices that monitor HVAC systems are either prohibitive or require professional contractors to integrate such devices in the system. Similar to the other units described herein, the HVAC monitoring unit 500 is minimally invasive and only requires the user to "stick" the unit 500 onto the appropriate HVAC duct 520. With the temperature probe 506 in contact with the duct 520, temperature deltas on heating and cooling cycles can be measured, recorded, and reported. One or more accelerometers 508 can also be integrated into the unit 500 to measure vibrations in the duct 520 caused by airflow. This allows the CPU 54 to conduct a Fourier analysis or other suitable computations on the collected data in order to determine changing frequency profiles over time. This allows the system 10 to detect early failures or deviations from the norm.

FIG. 20 illustrates a configuration similar to that shown in FIG. 19, but for an electricity monitoring unit 600 that is magnetically affixed to an electrical panel 74. The magnets 604 enable the housing 602 to be located in proximity to any available access to the panel 74 that allows one or more non-invasive current probes 606 with clamps 608 configured to encircle power lines 610, to be installed in the panel 74 as shown schematically in FIG. 20. This avoids the need to splice into existing wiring or even to modify the existing electrical wiring. The current sensor probes 606 allow the unit 600 to detect, monitor, and log current flow in those electrical lines 610. The current flow can be correlated to electricity usage in the monitored property 14. It can be appreciated that other sensors 50 in the unit 500 can include humidity, temperature and other sensors to ensure that the environment in which the panel 74 sits is suitable for electrical service. For example, a humidity sensor can detect other problems that could adversely affect the operation of the electrical service and ultimately the safety of the premises. A temperature reading can also indicate if there is a component in the panel 74 that is overheating. Similarly, an audio sensor could be used to detect if a circuit breaker has been tripped.

Figure 21:
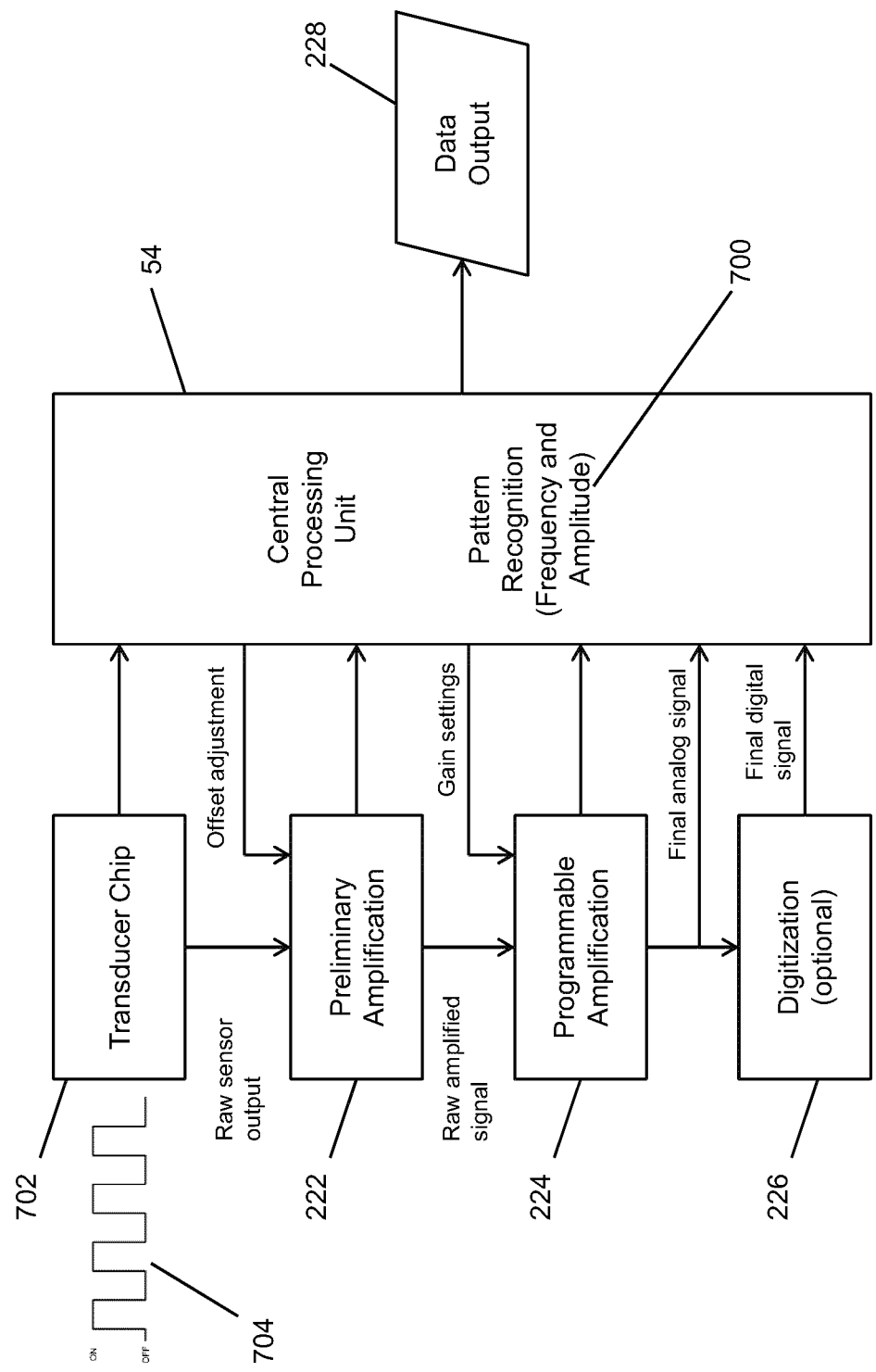
FIG. 21 is a block diagram illustrating a process for monitoring audible alarms within a premises from a third party device.

The architecture shown in FIG. 10 can also be utilized to implement an audible alarm detector as shown in FIG. 21. This allows $3^{rd}$ party devices 76 such as smoke and CO detectors to be monitored within the sensor system 12 as a secondary safety measure. For example, certain audible patterns can indicate that a battery needs to be changed or that the device 76 should be replaced, which can be fed into the cloud-based system 16 and provided as an alert 136. In this way, monitoring units that are existing and not normally incorporated into the sensor system 12 can benefit from the functionality of the sensor system 12. As shown in FIG. 21, a load repeated signal 704 that is broadcast from a $3^{rd}$ party device 76 (or even another of the units 30, 32) can be detected by a transducer chip 702 that provides a raw sensor input to the CPU 54 and preliminary amplification stage 222 as discussed above. However, in this case, a pattern recognition algorithm or routine 700 is programmed into the CPU 54 to enable the data output 228 to include data associated with the detection of an audible alarm detection.

Accordingly, the sensor system 12 described herein can include a multitude of different types of non-invasive devices that can be configured in a primary/secondary configuration to enable data that is measured and logged to be fed to the cloud 18 via a direct connection such as one with a cellular network 36 to avoid complex installation and initiation steps that would be required using invasive mechanical units and the need to connect through an existing local area network. This provides an easy to deploy and use sensor system 12 that is scalable and completely configurable to suit the particular monitored property 14. Moreover, the cloud-based system 16 enables users to receive alerts and monitor and analyze their own data whether or not they are in the premises. Importantly, this allows the monitored property 14 to be monitored while uninhabited to allow events to be detected as they happen instead of much later when significant damage can occur to the property 14.

For simplicity and clarity of illustration, where considered appropriate, reference numerals may be repeated among the figures to indicate corresponding or analogous elements. In addition, numerous specific details are set forth in order to provide a thorough understanding of the examples described herein. However, it will be understood by those of ordinary skill in the art that the examples described herein may be practiced without these specific details. In other instances, well-known methods, procedures and components have not been described in detail so as not to obscure the examples described herein. Also, the description is not to be considered as limiting the scope of the examples described herein.

It will be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

It will also be appreciated that any module or component exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the primary or secondary unit 30, 32 or systems 10, 16, any component of or related thereto, etc., or accessible or connectable thereto. Any application or module herein described may be implemented using computer readable/executable instructions that may be stored or otherwise held by such computer readable media.

The steps or operations in the flow charts and diagrams described herein are just for example. There may be many variations to these steps or operations without departing from the principles discussed above. For instance, the steps may be performed in a differing order, or steps may be added, deleted, or modified.

Although the above principles have been described with reference to certain specific examples, various modifications thereof will be apparent to those skilled in the art as outlined in the appended claims.

The invention claimed is:

1. A water flow monitoring unit, comprising:
    a housing comprising an adjustable interface mechanism for coupling the water flow monitoring unit to a water meter to be monitored and enforcing a positioning of at least one magnetic sensor contained within the housing relative to a magnetic core of the water meter, wherein the magnetic core of the water meter comprises a measurable magnetic characteristic that changes over time, wherein the housing comprises a concave inner surface that engages a curved outer surface of the water meter and maintains the positioning of the housing without altering the water meter, and wherein the at least one magnetic sensor is positioned within the housing adjacent the concave inner surface of the housing to align the at least one magnetic sensor with the magnetic core;
    at least one transceiver connectable to a cloud-based system via a long-range communication connection;
    a processor and memory contained in the housing for operating the at least one transceiver and the at least one magnetic sensor to: automatically characterize the behavior of the water meter being read to calibrate the at least one magnetic sensor to account for a plurality of types of water meters, measure primary data comprising the measurable magnetic characteristic according to the calibration, and provide the primary data to the cloud-based system over the long-range communication connection; and
    a power source for providing electrical power to the water flow monitoring unit.

2. The unit of claim 1, further comprising one or more sub-sensors for detecting sound and/or vibration externally to a water system to enable an analysis on the sound to be performed to determine when water is flowing.

3. The unit of claim 1, wherein the data collected enables a leak to be detected according to an abnormal water consumption pattern.

4. The unit of claim 1, wherein the processor is programmed to isolate an obtained signal from noise by automatically determining a signal offset in a quiet environment to compensate for direct current (DC) noise without utilizing a high pass filter.

5. The unit of claim 1, wherein the processor is programmed to analyze data during regular use and calculate an offset to compensate for DC noise in the system without implementing a high pass filter.

6. The unit of claim 1, wherein the at least one transceiver of the water flow monitoring unit is further connectable to at least one third party device to monitor an output of the third party device.

7. The unit of claim 6, wherein the output of the third party device is an audible alarm.

8. The unit of claim 7, wherein the third party device is a smoke and/or CO detector.

9. The unit of claim 1, further comprising the cloud-based system, the cloud-based system comprising:
    at least one portal to register the water flow monitoring unit;
    at least one client dashboard to access the primary and secondary data collected by the water flow monitoring unit and the at least one other sensor unit; and
    an engine connectable to at least one communication channel for communicating alerts, notifications, and/or events to user devices.

10. The unit of claim 9, further comprising at least one of:
    an online database;
    one or more third party device or service APIs; and
    access to one or more third party data sources or services.

11. The unit of claim 1, further comprising a cellular antenna for establishing the long-range communication connection with a cellular network.

12. The unit of claim 1, further comprising an array of a plurality of magnetic sensors.

13. The unit of claim 12, wherein the array of the plurality of sensors captures a position of the magnet in the water meter in various positions within the water meter to allow for error correction and improved accuracy in readings across a variety of water meters.

14. The unit of claim 12, wherein the array of sensors is positioned to remove noise and offset variations from different sensors to improve sensitivity and increase a signal to noise ratio.

15. The unit of claim 1, wherein:
the at least one transceiver is further connectable to: at least one other sensor unit in a monitored property comprising the water meter, to allow the at least one other sensor unit to provide data to the cloud-based system via the water flow monitoring unit; and
the processor and memory are further configured to: receive secondary data from the at least one other sensor unit, and provide the secondary data to the cloud-based system over the long-range communication connection.

16. The unit of claim 15, comprising a plurality of secondary sensor units each being connectable to the cloud-based system via one or more of the water flow monitoring unit.

17. The unit of claim 15, wherein the at least one other sensor unit comprises a quantity level monitoring unit, the quantity level monitoring unit comprising:
a housing comprising an interface mechanism for positioning at least one proximity sensor contained within the housing relative to a quantity level to be monitored, wherein the quantity level changes over time, wherein the interface mechanism maintains the positioning of the housing relative to a vessel containing the quantity level to be monitored without altering the vessel;
at least one transceiver connectable to the water flow monitoring unit via a short-range communication connection;
a processor and memory contained in the housing for operating the at least one transceiver and the at least one proximity sensor to measure the quantity level, and provide the data to the cloud-based system via the water flow monitoring unit over the long-range communication connection; and
a power source for providing electrical power to the quantity level monitoring unit.

18. The unit of claim 15, comprising at least one primary sensor unit in addition to the water flow monitoring unit that is connectable to the cloud-based system via the long-range communication connection or another long-range communication connection.

19. The unit of claim 15, further comprising:
a secondary sensor unit of the at least one sensor unit, the secondary sensor unit comprising:
a housing comprising an interface mechanism for positioning at least one sensor contained within or supported by the housing relative to an entity to be passively monitored by the secondary sensor unit, wherein the entity to be passively monitored by the secondary sensor unit comprises a measurable characteristic that changes over time, wherein the interface mechanism comprises a portion of the housing or an additional component that maintains the positioning of the housing relative to a resource exhibiting the measurable characteristic, to passively monitor the measurable characteristic without requiring a physical alteration to the entity to be monitored;
at least one transceiver connectable to the water flow monitoring unit via a short-range communication connection;
a processor and memory contained in the housing for operating the at least one transceiver and the at least one sensor to passively measure or obtain the secondary data from the monitored entity, and provide the secondary data to the cloud-based system via the water flow monitoring unit over the long-range communication connection by sending the secondary data to the water flow monitoring unit via the short-range communication connection; and
a power source for providing electrical power to the secondary sensor unit.

20. The unit of claim 19, wherein the at least one transceiver of the second sensor unit is further connectable to at least one third party device to monitor an output of the third party device.

21. The unit of claim 19, wherein the interface mechanism of the secondary sensor unit comprises a clamp.

22. The unit of claim 21, wherein the clamp is rotatable to allow for the housing to be oriented in a plurality of positions relative to a structure to which it is attached.

23. The unit of claim 19, wherein the interface mechanism of the secondary sensor unit comprises one or more magnets to secure the housing against a metallic surface of the entity being monitored.

24. The unit of claim 23, wherein magnetic attachment of the housing to the entity being monitored engages a sensor contained in or supported by the housing, with the metallic surface, for monitoring same.

25. The unit of claim 19, wherein the interface mechanism of the secondary sensor unit comprises a contoured surface to provide a gap between at least one sensor contact and an underlying surface.

26. The unit of claim 25, wherein the underlying surface is a floor and the at least one sensor contact is for detecting the presence of fluid.

27. The unit of claim 15, wherein the at least one other sensor unit comprises a flood detection unit, the flood detection unit comprising:
a housing comprising at least one surface that is contoured for positioning at least one sensor contained within the housing relative to an underlying surface to be monitored, wherein the underlying surface is normally dry and the at least one sensor is to detect a presence of a spill or flood;
at least one transceiver connectable to the water flow monitoring unit via a short-range communication connection;
a processor and memory contained in the housing for operating the at least one transceiver and the at least one sensor to detect the presence of a spill or flood, and when detected, provide secondary data to the water flow monitoring unit over the short-range communication connection; and
a power source for providing electrical power to the flood detection unit.

28. The unit of claim 27, wherein the at least one sensor of the flood detection unit comprises a pair of contacts positioned close to but above the underlying surface.

29. The unit of claim 1, wherein the adjustable interface mechanism comprises a strap for securing the housing against the water meter.

30. The unit of claim 1, wherein the processor is programmed to determine an ideal amplification of a signal and programmatically control a gain to achieve an ideal signal amplitude.

31. A method of monitoring a property, the method comprising:

positioning at least one magnetic sensor contained within a housing of a water flow monitoring unit relative to a water meter to be passively monitored by the water flow monitoring unit using an adjustable interface mechanism of the housing for coupling the water flow monitoring unit to the water meter to be monitored, wherein a magnetic core of the water meter comprises a measurable magnetic characteristic that changes over time, wherein the housing comprises a concave inner surface that engages a curved outer surface of the water meter and maintains the positioning of the housing without altering the water meter and wherein the at least one magnetic sensor is positioned within the housing adjacent the concave inner surface of the housing to align the at least one magnetic sensor with the magnetic core;

enabling at least one transceiver in the water flow monitoring unit to be connectable to a cloud-based system via a long-range communication connection;

automatically characterizing the behavior of the water meter being read to calibrate the at least one magnetic sensor to account for one of a plurality of types of water meters;

operating the at least one magnetic sensor to passively measure or obtain primary data from the water meter according to the calibration; and utilizing the at least one transceiver to provide the primary data to the cloud-based system over the long-range communication connection.

32. The method of claim 31, wherein the at least one sensor is operated without additional set up steps being performed by a user.

33. The method of claim 32, further comprising performing at least one calibration or noise reduction operation automatically upon powering up the water flow monitoring unit.

34. The method of claim 31, further comprising registering the water flow monitoring unit with the cloud-based system prior to having the water flow monitoring unit provide data to the cloud-based system.

35. The method of claim 31, further comprising using an array of a plurality of magnetic sensors.

36. The method of claim 35, further comprising using the array of the plurality of sensors to capture the position of the magnet in the water meter in various positions within the water meter to allow for error correction and improved accuracy in readings across a variety of water meters.

37. The method of claim 35, wherein the array of sensors is positioned to remove noise and offset variations from different sensors to improve sensitivity and increase a signal to noise ratio.

38. The method of claim 31, further comprising determining an ideal amplification of a signal and programmatically control a gain to achieve an ideal signal amplitude.

39. The method of claim 31, further comprising using one or more sub-sensors to detect sound and/or vibration externally to a water system to enable an analysis on the sound to be performed to determine when water is flowing.

40. The method of claim 31, further comprising using data collected from the water meter to enable a leak to be detected according to an abnormal water consumption pattern.

41. The method of claim 31, further comprising isolating an obtained signal from noise by automatically determining a signal offset in a quiet environment to compensate for direct current (DC) noise without utilizing a high pass filter.

42. The method of claim 31, further comprising analyzing data during regular use and calculating an offset to compensate for DC noise in the system without implementing a high pass filter.

* * * * *